(12) United States Patent
Nakamura et al.

(10) Patent No.: US 12,347,641 B2
(45) Date of Patent: Jul. 1, 2025

(54) CHARGED PARTICLE BEAM PATTERN FORMING DEVICE AND CHARGED PARTICLE BEAM APPARATUS

(71) Applicant: KABUSHIKI KAISHA TOSHIBA, Tokyo (JP)

(72) Inventors: Hiroko Nakamura, Yokohama Kanagawa (JP); Tomohiro Saito, Yokohama Kanagawa (JP); Yoshiaki Shimooka, Sagamihara Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 387 days.

(21) Appl. No.: 17/929,826

(22) Filed: Sep. 6, 2022

(65) Prior Publication Data

US 2023/0298848 A1 Sep. 21, 2023

(30) Foreign Application Priority Data

Mar. 19, 2022 (JP) ................. 2022-044753

(51) Int. Cl.
*H01J 37/20* (2006.01)
*H01J 37/09* (2006.01)
*H01J 37/28* (2006.01)

(52) U.S. Cl.
CPC .............. *H01J 37/20* (2013.01); *H01J 37/09* (2013.01); *H01J 37/28* (2013.01);
(Continued)

(58) Field of Classification Search
CPC .. H01J 37/20; H01J 37/09; H01J 37/28; H01J 2237/0453; H01J 2237/0455;
(Continued)

(56) References Cited

U.S. PATENT DOCUMENTS

| 4,243,866 A | * | 1/1981 | Pfeiffer | ................. | H01J 37/147 |
| | | | | | 219/121.25 |
| 4,683,366 A | * | 7/1987 | Harte | .................... | B82Y 40/00 |
| | | | | | 219/121.25 |

(Continued)

FOREIGN PATENT DOCUMENTS

| JP | S62-24547 A | 2/1987 |
| JP | 2000-48754 A | 2/2000 |

(Continued)

OTHER PUBLICATIONS

Hiroshi Yasuda et al., "Fast Electron Beam Lithography System with 1024 Beams Individually Controlled by Blanking Aperture Array," Jpn. J. Appl. Phys., vol. 32, pp. 6012-6017 (1993).

*Primary Examiner* — David A Vanore
(74) *Attorney, Agent, or Firm* — Finnegan, Henderson, Farabow, Garrett & Dunner, LLP

(57) ABSTRACT

A charged particle beam pattern forming device is described, a charged particle beam passing through a third aperture for forming a charged particle beam pattern, the charged particle beam pattern forming device including: a first element including a first aperture, a second element including a second aperture, the second aperture overlapping the first aperture, wherein the third aperture is defined by an overlap of the first aperture and the second aperture, and a shape of the third aperture is capable of being changed by a driver such that the first element is moved in a first direction and the second element is moved in a second direction opposite to the first direction.

20 Claims, 33 Drawing Sheets

(52) U.S. Cl.
CPC ............... *H01J 2237/0453* (2013.01); *H01J 2237/0455* (2013.01); *H01J 2237/0458* (2013.01)

(58) Field of Classification Search
CPC ....... H01J 2237/0458; H01J 2237/2817; H01J 2237/31774
See application file for complete search history.

(56) References Cited

U.S. PATENT DOCUMENTS

| | | | | |
|---|---|---|---|---|
| 4,825,033 A | * | 4/1989 | Beasley | H01J 37/3007 219/121.25 |
| 5,153,441 A | * | 10/1992 | Moriizumi | H01J 37/09 250/398 |
| 5,759,423 A | * | 6/1998 | Sohda | H01J 37/3174 216/45 |
| 5,886,357 A | * | 3/1999 | Kojima | H01J 37/3174 250/397 |
| 5,977,548 A | * | 11/1999 | Oae | B82Y 40/00 250/397 |
| 6,225,637 B1 | * | 5/2001 | Terashima | B82Y 10/00 250/492.2 |
| 6,232,612 B1 | * | 5/2001 | Nakajima | H01J 37/3026 250/492.23 |
| 7,109,494 B2 | * | 9/2006 | Ono | H01J 37/045 250/492.23 |
| 7,714,308 B2 | * | 5/2010 | Hiroshima | H01J 37/1472 250/492.23 |
| 8,546,767 B2 | * | 10/2013 | Platzgummer | H01J 37/045 250/492.2 |
| 8,563,951 B2 | * | 10/2013 | Choi | G03F 1/78 250/492.23 |
| 9,552,957 B2 | * | 1/2017 | Zeidler | H01J 37/28 |
| 10,483,088 B2 | * | 11/2019 | Iizuka | H01J 37/3023 |
| 10,784,077 B2 | * | 9/2020 | Zhang | H01J 37/265 |
| 2005/0233227 A1 | * | 10/2005 | Yang | G03F 1/68 430/30 |
| 2006/0192148 A1 | * | 8/2006 | Ogasawara | B82Y 10/00 250/492.22 |
| 2007/0138403 A1 | | 6/2007 | Cubric et al. | |
| 2008/0054196 A1 | * | 3/2008 | Hiroshima | B82Y 40/00 250/492.23 |
| 2009/0314950 A1 | * | 12/2009 | Iizuka | H01J 37/3174 250/397 |
| 2010/0266959 A1 | * | 10/2010 | Lee | B82Y 40/00 430/296 |
| 2011/0186744 A1 | * | 8/2011 | Anze | H01J 3/14 250/492.1 |
| 2012/0148959 A1 | * | 6/2012 | Choi | H01J 37/3174 430/296 |
| 2012/0292535 A1 | * | 11/2012 | Choi | H01J 37/3174 250/492.22 |
| 2013/0052569 A1 | * | 2/2013 | Choi | H01J 37/3026 430/5 |
| 2015/0200074 A1 | * | 7/2015 | Hamaguchi | H01J 37/3177 250/396 R |
| 2018/0138013 A1 | * | 5/2018 | Iizuka | H01J 37/045 |
| 2018/0210353 A1 | * | 7/2018 | Nishimura | G03F 7/2059 |
| 2020/0203116 A1 | | 6/2020 | Winkler et al. | |
| 2022/0319797 A1 | * | 10/2022 | Gu | H01J 37/09 |

FOREIGN PATENT DOCUMENTS

| | | |
|---|---|---|
| JP | 2006-140267 A | 6/2006 |
| JP | 2007-19210 A | 1/2007 |
| JP | 2007-504606 A | 3/2007 |
| JP | 2020-102452 A | 7/2020 |

* cited by examiner

Fig.2
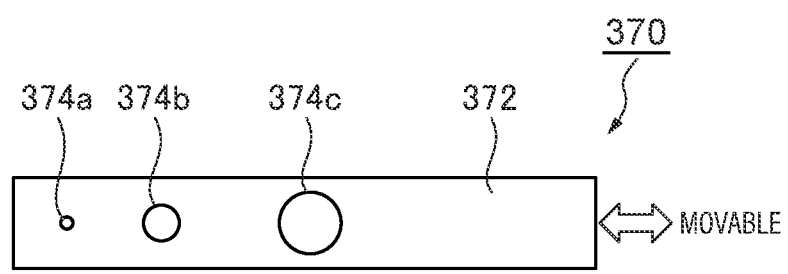
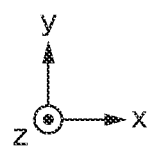

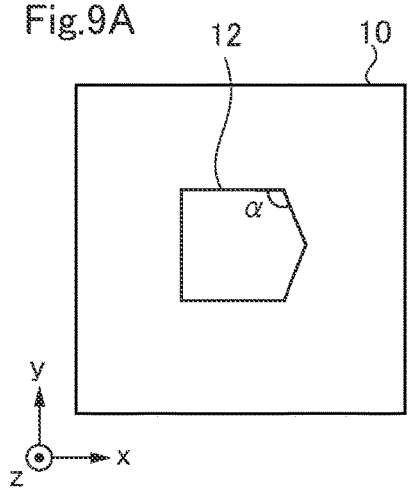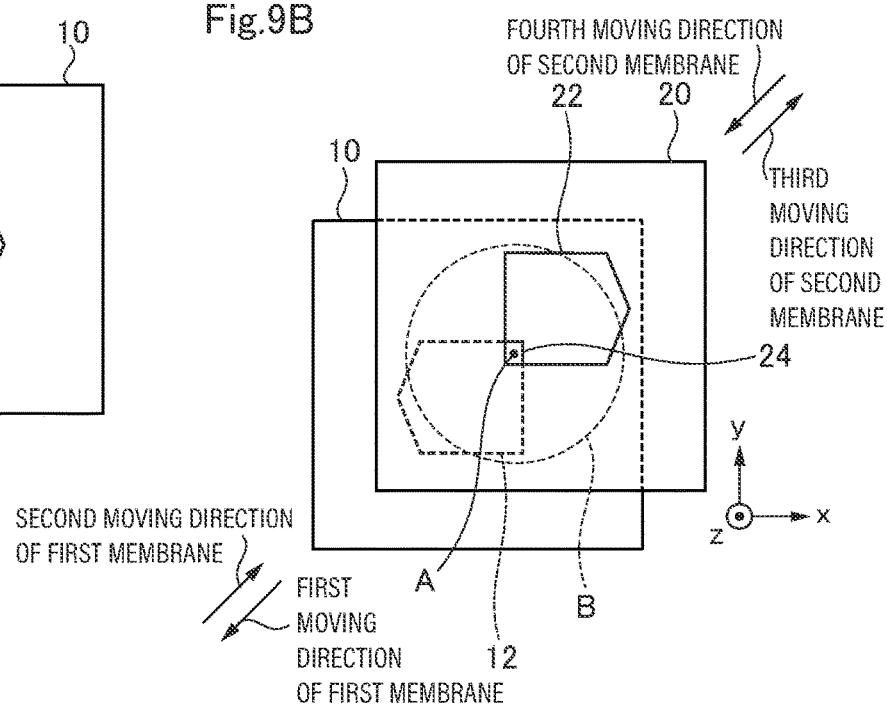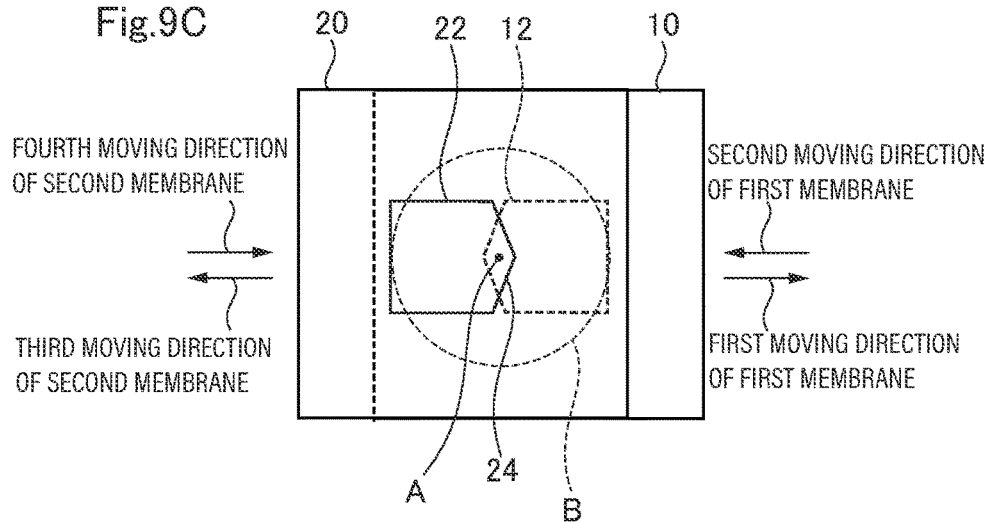

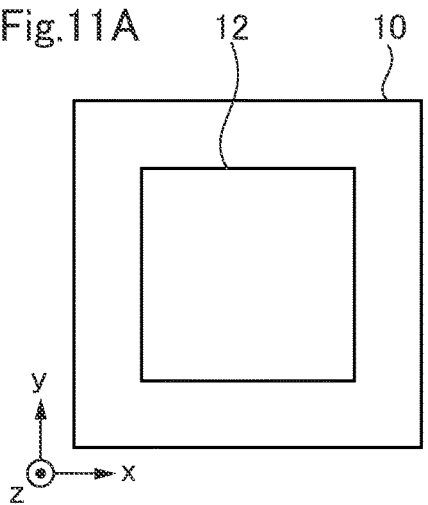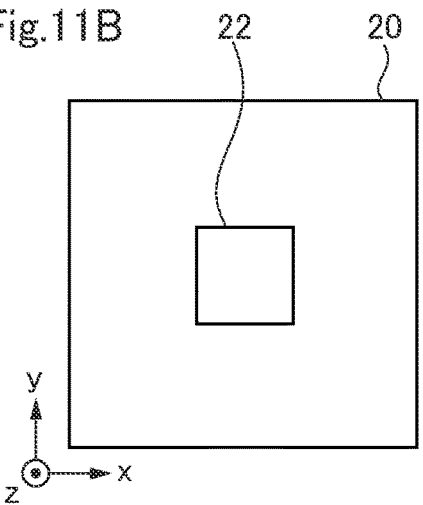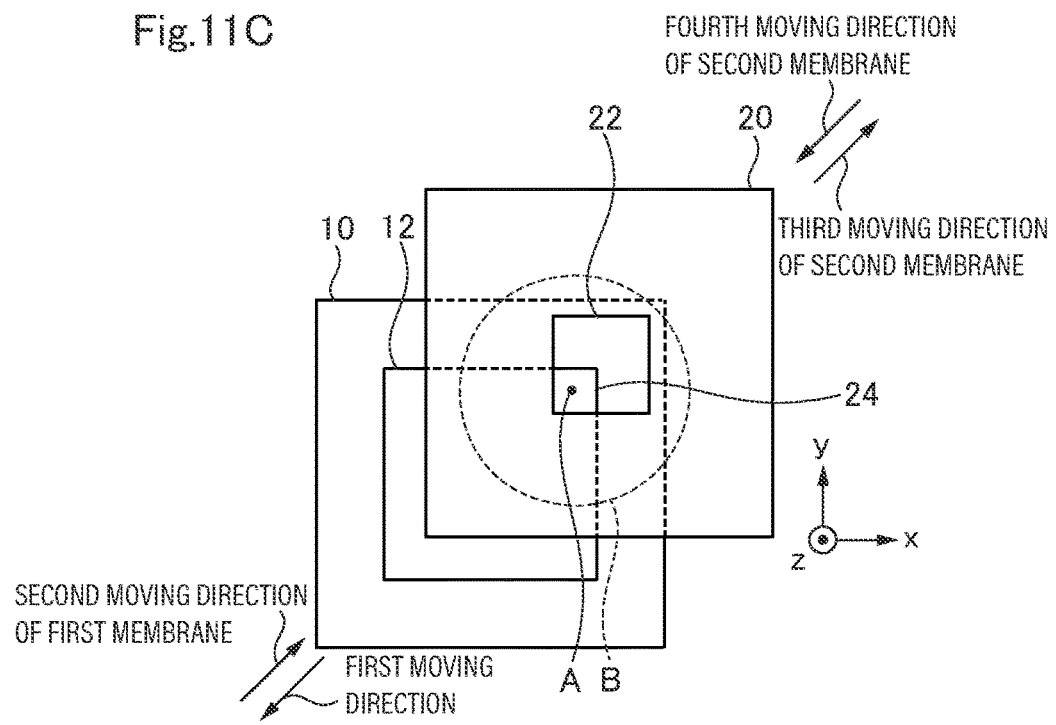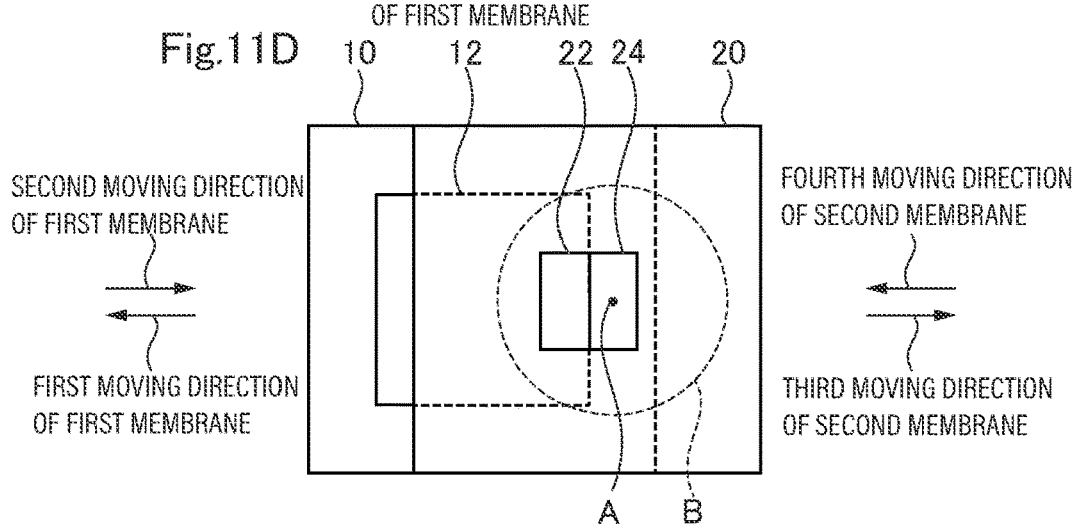

APERTURE OF FIRST PLATE

MEMBRANE COMMON APERTURE

APERTURE OF SECOND PLATE

MEMBRANE COMMON APERTURE

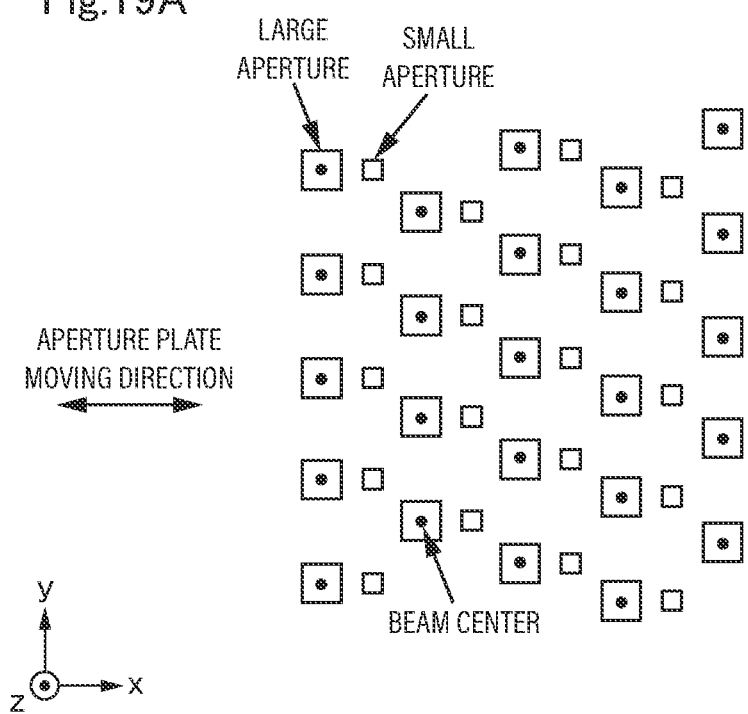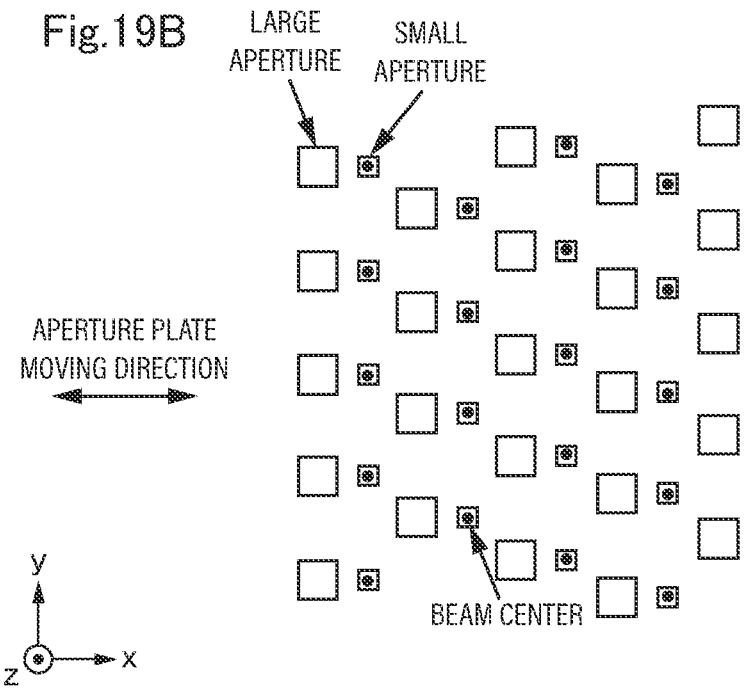

Fig.25A  SECOND MOVING DIRECTION OF FIRST MEMBRANE      FOURTH MOVING DIRECTION OF SECOND MEMBRANE
FIRST MOVING DIRECTION OF FIRST MEMBRANE      THIRD MOVING DIRECTION OF SECOND MEMBRANE
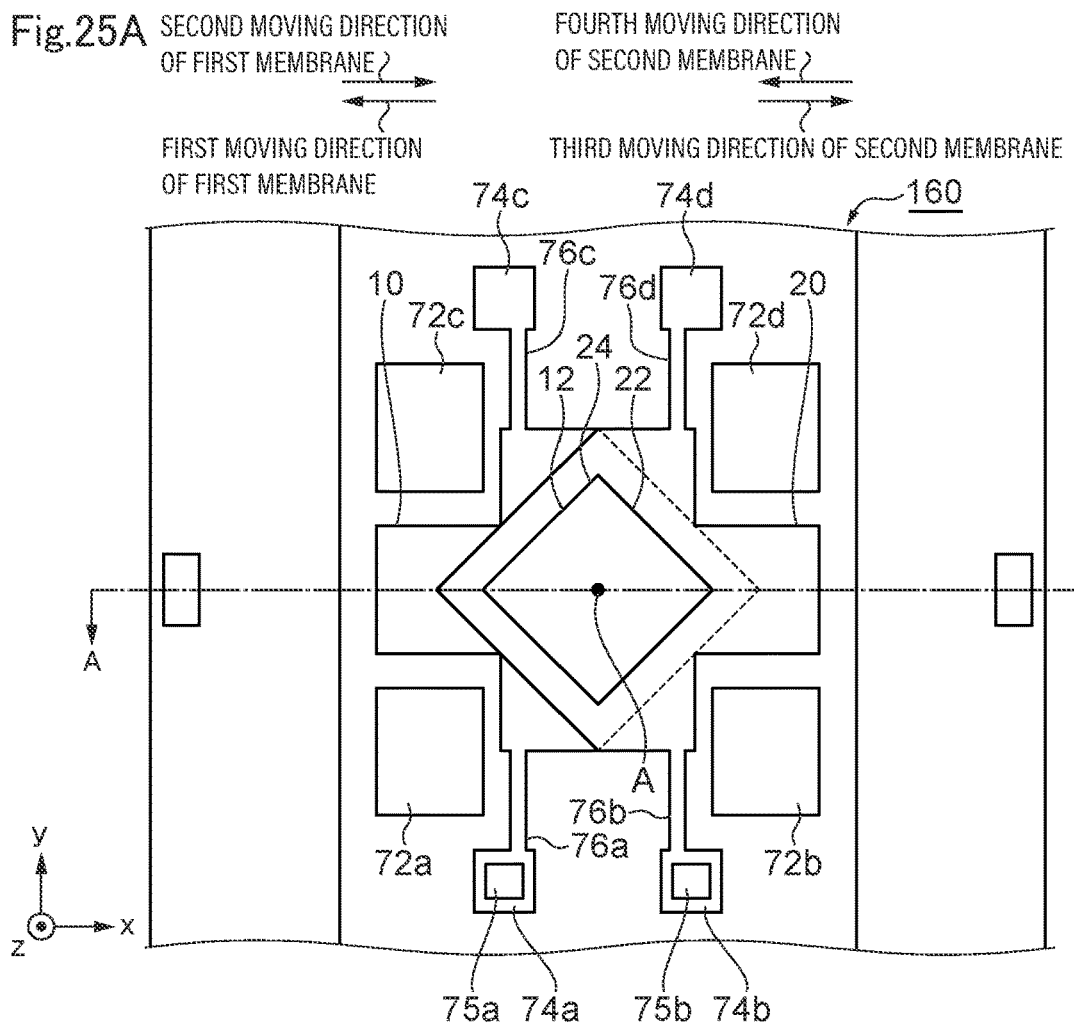
Fig.25B
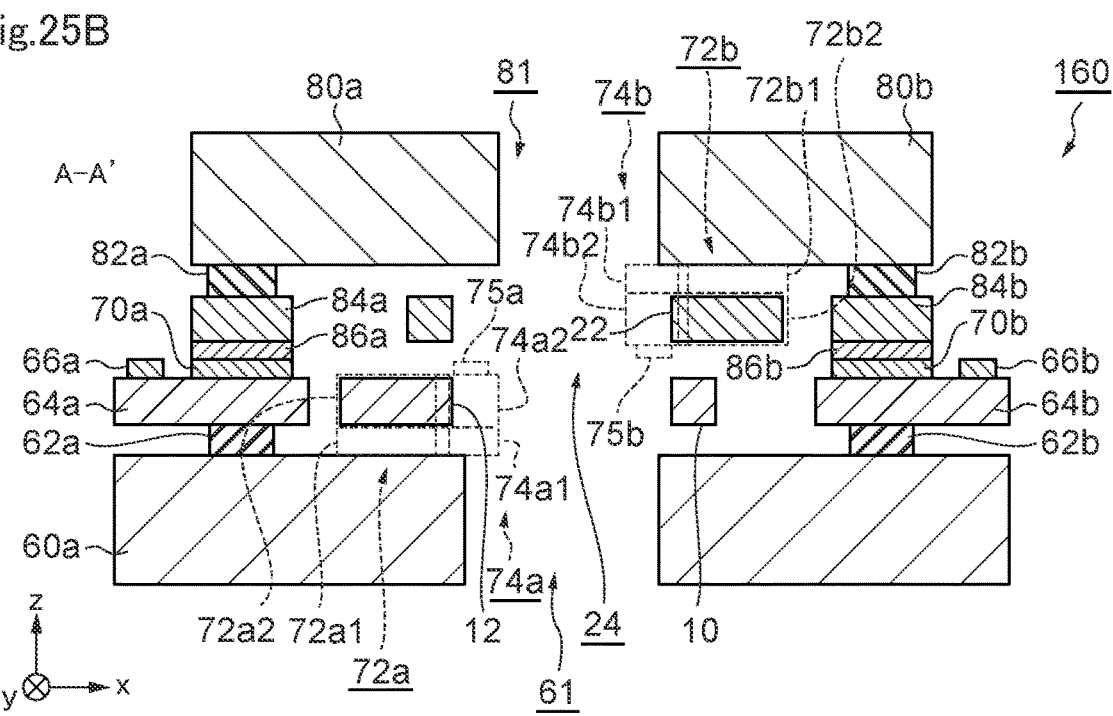

Fig.27A SECOND MOVING DIRECTION OF FIRST MEMBRANE
FOURTH MOVING DIRECTION OF SECOND MEMBRANE
FIRST MOVING DIRECTION OF FIRST MEMBRANE
THIRD MOVING DIRECTION OF SECOND MEMBRANE
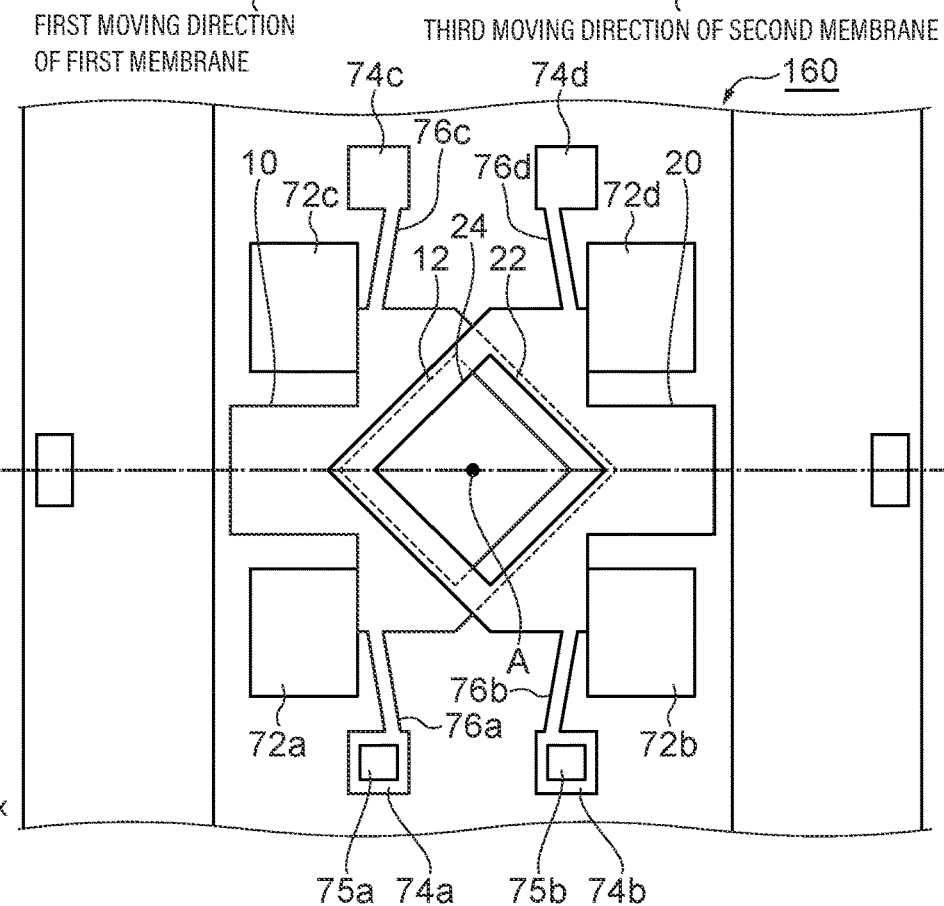
Fig.27B
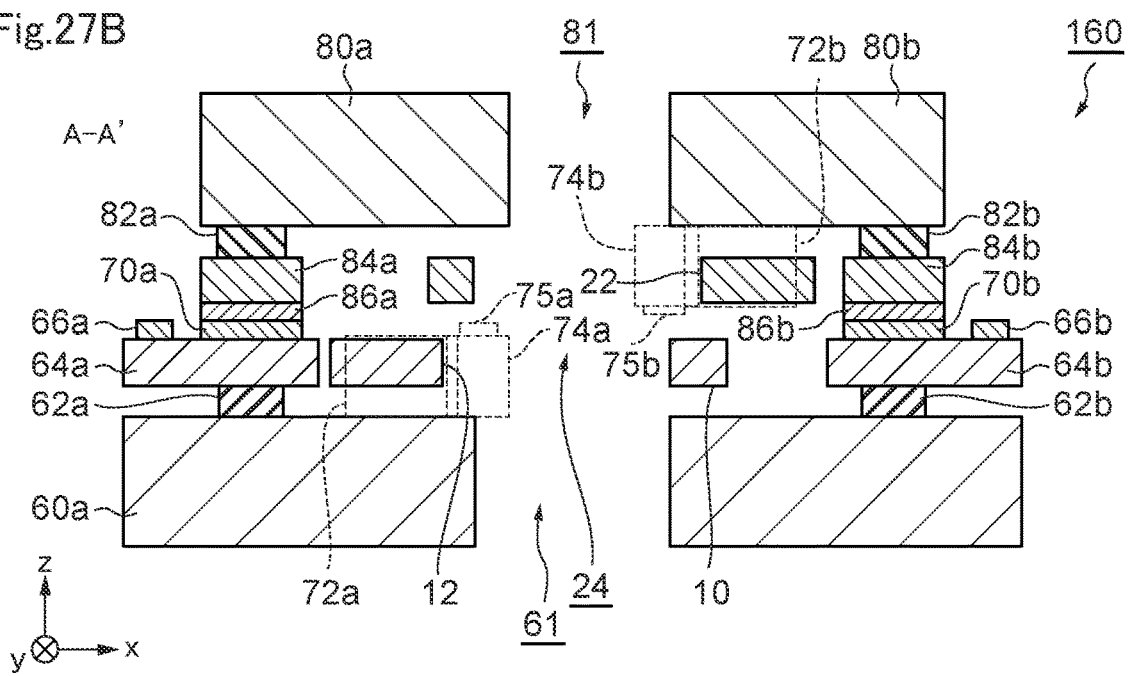

A-A'

CHARGED PARTICLE BEAM PATTERN FORMING DEVICE AND CHARGED PARTICLE BEAM APPARATUS

CROSS-REFERENCE TO RELATED APPLICATION

This application is based upon and claims the benefit of priority from Japanese Patent Application No. 2022-044753, filed on Mar. 19, 2022, the entire contents of which are incorporated herein by reference.

FIELD

Embodiments described herein relate generally to charged particle beam pattern forming device and charged particle beam apparatus.

BACKGROUND

Charged particle beam apparatus, particularly the apparatus using electron beam, is used as drawing apparatus for masks and wafers in lithography.

The charged particle beam apparatus is also used as a microscope for observing the topography of a material, such as a scanning electron microscope or a He (helium) ion microscope. Furthermore, utilizing such a microscopic function of the charged particle beam apparatus, the charged particle beam apparatus is also used as a defect inspection apparatus for observing defects generated in a semiconductor wafer product, a mask used in the semiconductor, the liquid crystal display, or the like.

Multi-beams devices, which allow the use of a plurality of beams, are also recently being used to increase speed. In such a multi-beams device, for example, the electron beam emitted from an electron gun is passed through the shaping aperture and multi-beams are formed. The multi-beams are blanking controlled. Each unshielded beam is reduced in the optical system, and the mask image is reduced and deflected at deflector to the desired position on target object.

BRIEF DESCRIPTION OF THE DRAWINGS

FIG. 2 is a schematic diagram illustrating an exemplary aperture plate.

FIG. 9A-C are schematic diagrams illustrating a method of changing the diameter of an electron beam B using the first membrane and the second membrane in a modification of the first embodiment.

FIG. 11A-D are schematic diagrams illustrating a method of changing the diameter of an electron beam B using the first membrane and the second membrane in a modification of the first embodiment.

FIG. 19A-B are schematic top views indicating the size of apertures of the respective plates of the comparative embodiment of the second embodiment.

FIG. 25A-B are schematic diagrams of the shaping aperture array for the charged particle beam apparatus of the fourth embodiment.

FIG. 27A-B are schematic diagrams showing a state when forming an electron beam having a smaller beam diameter using the shaping aperture array for the charged particle beam apparatus of the fourth embodiment.

DETAILED DESCRIPTION

Figure 1:
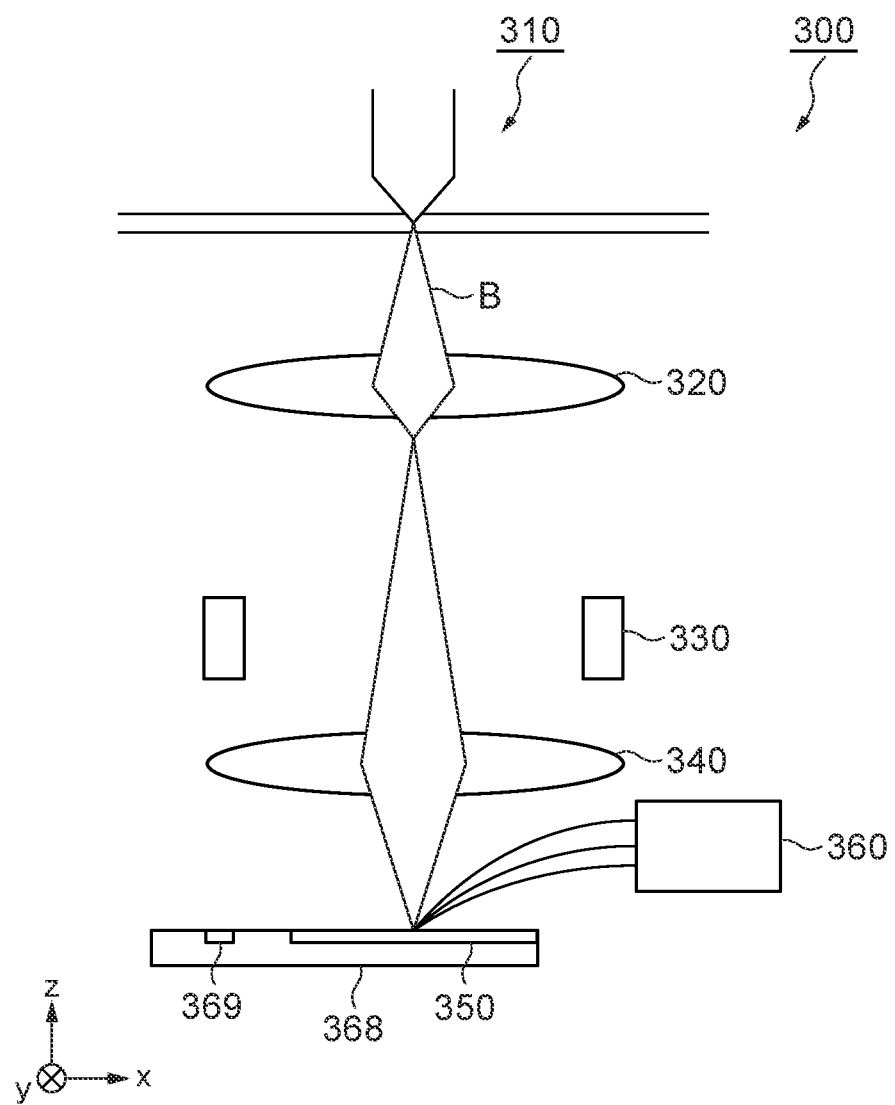
FIG. 1 is schematic diagram of the scanning electron microscopy of a first embodiment.

Hereinafter, embodiments will be described with reference to the drawings. In the drawings, the same or similar parts are denoted by the same or similar reference numerals.

First Embodiment

A charged particle beam pattern forming device of a present embodiment includes a first element having a first aperture and a second element having a second aperture. The second aperture is provided so that the second aperture overlaps the first aperture. The beam diameter is adjusted by passing a charged particle beam through the common aperture of both the first aperture and the second aperture. In the charged particle beam pattern forming device of the present embodiment, a charged particle beam passes through a third aperture for forming a charged particle beam pattern, the charged particle beam pattern forming device including: a first element including a first aperture, a second element including a second aperture, the second aperture overlapping the first aperture, wherein the third aperture is defined by an overlap of the first aperture and the second aperture, and a shape of the third aperture is capable of being changed by a driver such that the first element is moved in a first direction and the second element is moved in a second direction opposite to the first direction.

The charged particle beam apparatus of the present embodiment includes the above charged particle beam pattern forming device. In the following, the shaping aperture array for the charged particle beam apparatus is an exemplary a charged particle beam pattern forming device.

FIG. 1 is schematic diagram of a scanning electron microscopy 300 of the present embodiment. Incidentally, the scanning electron microscope 300 is an example of a charged particle beam apparatus. The present embodiment illustrates a single-beam charged particle beam apparatus using a single-beam electron microscope 300 as an example.

An electron gun 310 emits electrons. The electron gun 310 is an example of a discharge unit (emitter).

Here, an X-axis, a Y-axis intersecting perpendicularly to the X-axis, and a Z-axis intersecting perpendicularly to the X-axis and Y-axis, are defined. It is assumed that the electron beam B emitted from electron gun 310 is emitted parallel to the Z-direction. An optical axis A of the electron beam B is parallel to the Z-direction. Incidentally, the electron beam B is an example of a charged particle beam.

The electron beam B emitted from the electron gun 310 is focused and reduced by the focusing lens 320 and the objective lens 340 and is irradiated to the target object 350. Here, as the focusing lens 320 and the objective lens 340, for example, a magnetic field lens is preferably used. The scan coil 330 illuminates the electron beam B at any point on the target object 350. The scanning coil 330 is, for example, a deflection coil. The secondary electrons emitted from the target object 350 are detected by the detector 360. The detector 360 includes, for example, an electron multiplier. By such an electron multiplier, the secondary electrons are detected by being amplified. The detector 360 may detect reflected electrons emitted from target object 350.

FIG. 2 is a schematic diagram showing an example of an aperture plate 370 as a comparative example. The aperture plate 370 has an aperture 374a, an aperture 374b, and an aperture 374c as the apertures 374. The aperture 374a, the aperture 374b, and the aperture 374c are circular apertures formed perpendicular to the plane 372 of the aperture plate 370. Here, the diameters of the aperture 374a, the aperture 374b, and the aperture 374c are different from each other. The aperture 374c has the largest diameter. The diameter decreases in the order of the aperture 374b and the aperture 374a.

For example, the aperture plate 370 is inserted between the focusing lens 320 and the objective lens 340 of the scanning electron microscope 300 shown in FIG. 1. Also, for example, it is assumed that the plane 372 of the aperture plate 370 is disposed parallel to the XY plane in the scanning electron microscope 300. When the electron beam B passes through the aperture 374a, and when passing through the aperture 374b, and when passing through aperture 374c, the diameter of the electron beam B formed will be different. Note that, for example, it is assumed that the aperture plate 370 is movable in the X-direction as shown in the comparative example in FIG. 2. By moving the aperture plate 370 in the X-direction, the electron beam B can be passed through the aperture 374 having differing diameters. In this way, the beam diameter of the electron beam B can be changed.

Figure 3A:
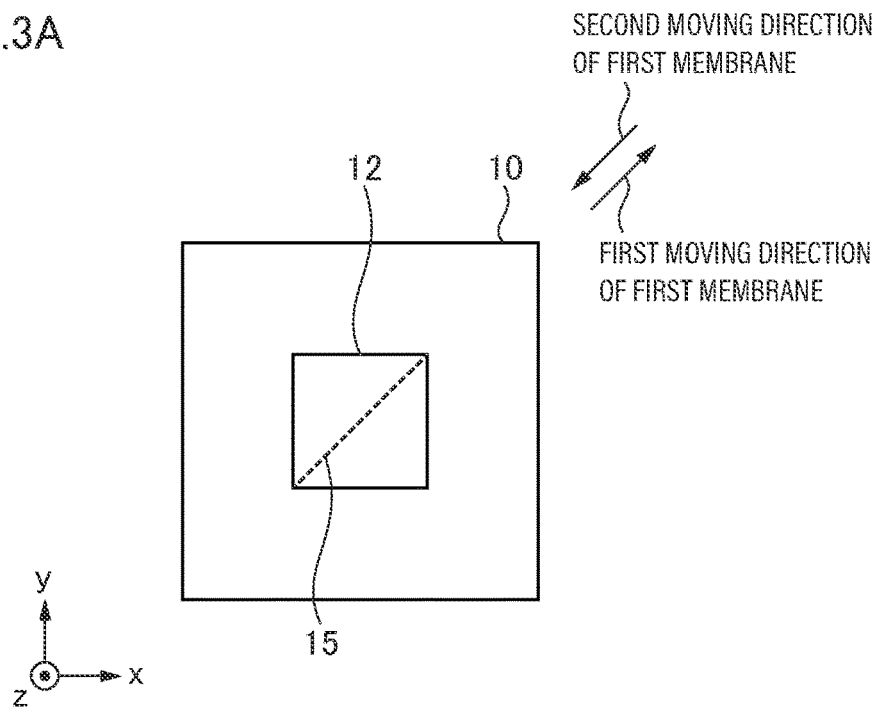
FIG. 3A-B are schematic top views of a first membrane and a second membrane used in shaping aperture array for the charged particle beam apparatus of the first embodiment.
Figure 3B:
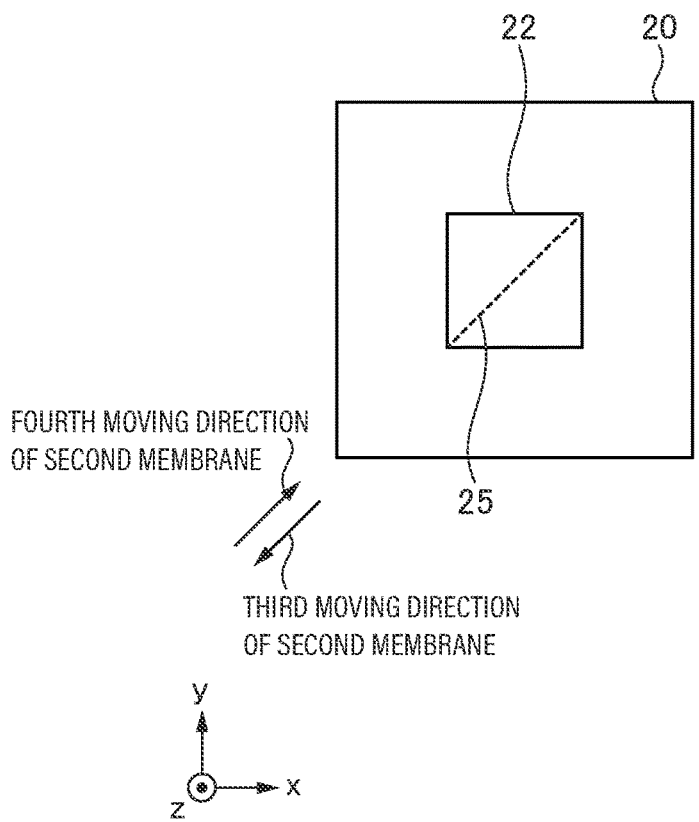
Figure 4A:
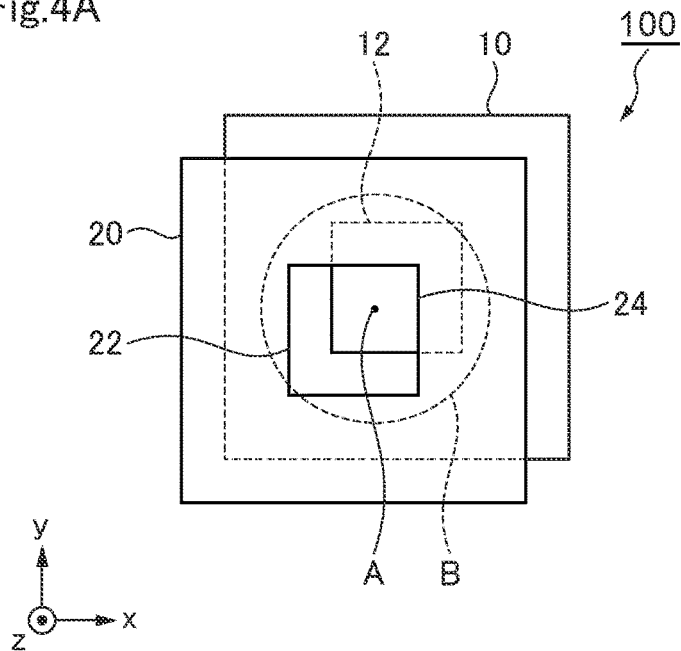
FIG. 4A-B schematic diagrams showing a method of changing the diameter of the electron beam B using the first membrane and the second membrane in the first embodiment.
Figure 4B:
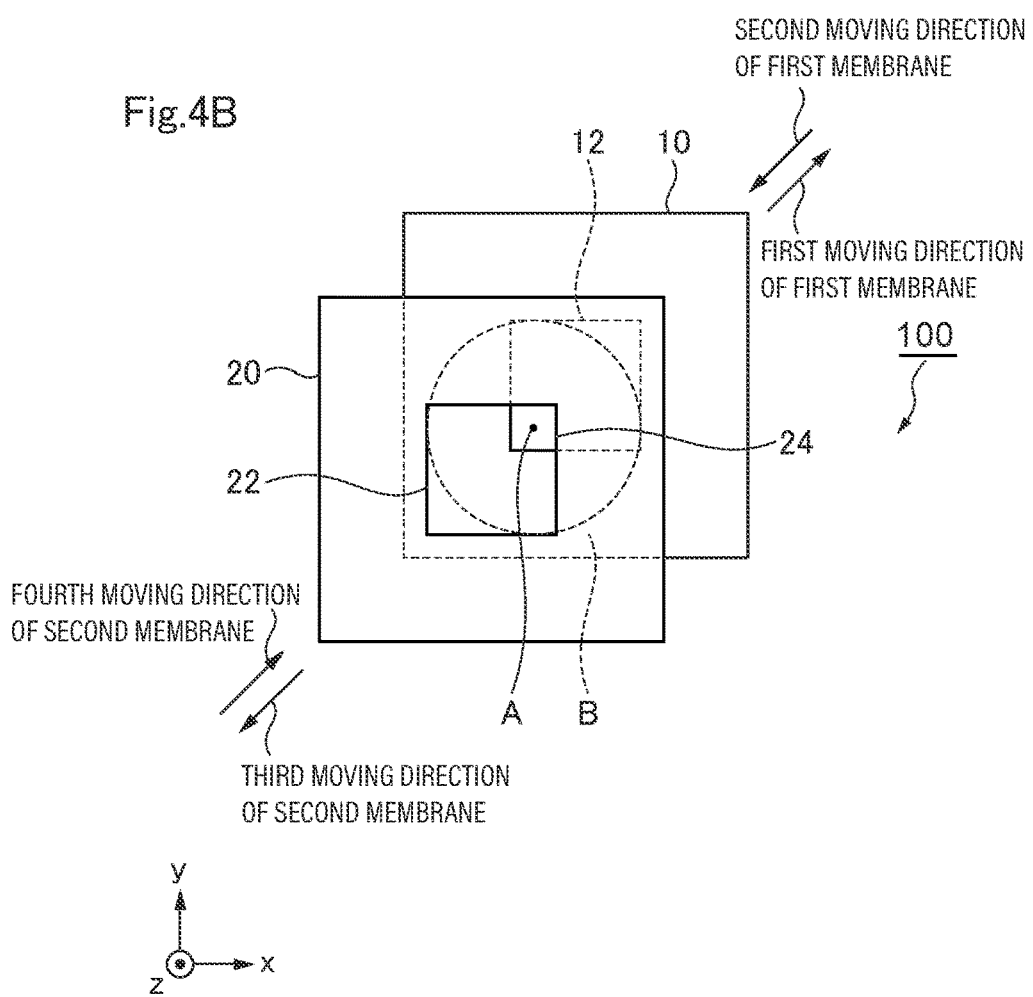

FIG. 3A-B are schematic top views of the first membrane (plate) 10 and the second membrane 20 used in the shaping aperture array for charged particle beam apparatus 100 in the present embodiment. FIG. 4A-B are schematic diagrams showing how to change the diameter of the electron beam B using the first membrane 10 and the second membrane 20 in the present embodiment. The surface of the first membrane 10 and the surface of the second membrane 20 are provided parallel to the XY plane. Then, a film thickness of the first membrane 10 parallel to Z-direction and a film thickness of the second membrane 20 parallel to Z-direction are, for example, several 10 of nm or more and 200 nm or less. If the film thickness of the first membrane 10 parallel to the Z-direction and the film thickness of the second membrane 20 parallel to the Z-direction is too thick, secondary electrons and scattered electrons are generated from the first membrane 10 or the second membrane 20. Thereby, heat may be generated from the first membrane 10 or the second membrane 20 In addition, the first membrane 10 or the second membrane 20 may be charged when the surface of the first membrane 10 or the second membrane 20 is highly resistant.

FIG. 3A shows a schematic top view of the first membrane 10. The first membrane 10 has a first aperture 12. The first membrane 10 is manufactured, for example, by forming the first aperture 12 on a silicon-based substrate by a MEMS (Micro Electro Mechanical Systems) process and forming a metal film (not shown). Here, MEMS process is a process of manufacturing a predetermined structure by performing patterning or etching or the like in semiconductor process. Further, it is preferable that the metal film contains, for example, Pt (platinum), Au (gold), W (tungsten), or CrN (chromium nitride), since it is difficult to be oxidized and good conductive characteristics can be obtained. However, the material contained in the metal film is not limited thereto. In addition, it is not necessary to use a Si substrate for the first membrane 10 For example, the first membrane 10 may be a thin metallic film. Note that the material and the process in which the first membrane 10 is formed are not particularly limited to those described above. The first membrane 10 is electrically connected to a ground-electrode (not shown). Charges due to the electron beam B irradiated on the surface of the first membrane 10 flows to the ground electrode. The first membrane 10 is an example of a first element. Here, "the first element" includes "the first membrane".

FIG. 3B shows a schematic top view of the second membrane 20. The second membrane 20 has a second aperture 22. The second membrane 20 is manufactured, for example, by forming the second aperture 22 on a silicon-based substrate by a MEMS (Micro Electro Mechanical Systems) process and forming a metal film (not shown). Here, it is preferable that the metal film contains, for example, Pt (platinum), Au (gold), W (tungsten), or CrN (chromium nitride), since it is difficult to be oxidized and good conductive characteristics can be obtained. However, the material contained in the metal film is not limited thereto. In addition, it is not necessary to use a Si substrate for the second membrane 20. For example, the second membrane 20 may be a thin metallic film. Note that the material and the process in which the second membrane 20 is formed are not particularly limited to those described above. The second membrane 20 is electrically connected to a ground-electrode (not shown). Charges due to the electron beam B irradiated on the surface of the second membrane 20 flows to the ground electrode. The second membrane 20 is an example of a second element. Here, "the second element" includes "the second membrane".

In FIG. 4A, it is shown that a portion of first aperture 12 and a portion of second aperture 22 overlap each other, so that a new third aperture 24 is provided. Optical axis A of the electron beam B is adjusted to pass through the center of third aperture 24. When the electron beam B is irradiated, the electron beam B passes through the third aperture 24. Therefore, the electron beam B having a diameter corresponding to the size of the third aperture 24 in a plane parallel to the XY plane is formed.

In FIG. 4B, the first membrane 10 and the second membrane 20 are moved in opposite directions in a plane parallel to the XY plane, respectively, to reduce the size of the third aperture 24 in a plane parallel to the XY plane. In this way, the size of the third aperture 24 can be reduced by, for example, moving the first membrane 10 in a first moving direction and moving the second membrane 20 in a third moving direction opposite to the first moving direction. In such cases, the diameter of the electron beam B formed by passing through the third aperture 24 is smaller than that of FIG. 4A.

By moving the first membrane 10 in the second moving direction opposite to first moving direction and moving the second membrane 20 in the fourth moving direction opposite to the third moving direction, the size of the third aperture 24 in the plane parallel to the XY-plane can be increased.

The first moving direction is example of a first direction. The third moving direction is an example of a second direction.

In addition, the second moving direction is an exemplary first direction. Then, the fourth moving direction is an example of a second orientation.

The shape of the first aperture 12 is, but not limited to, a square (first square), for example. In addition, the first moving direction and the second moving direction of the first membrane are parallel to, for example, but not limited to, a square (first square) first diagonal line 15. The shape of second aperture 22 is, but not limited to, a square (second square), for example. The third moving direction and the fourth moving direction of the second membrane are parallel to, for example, but not limited to, a square (second square) second diagonal line 25.

Further, for example, the shape of the first aperture 12 and the shape of the second aperture 22 are equal. It is preferable that the shape of the first aperture 12 is a square (first square) in that it facilitates the handling of lithography and drawing processes because the square has a relatively high-symmetry shape. Furthermore, the first moving direction and the second moving direction of the first membrane are preferably parallel to the first diagonal line 15 of the square (first square). The second aperture 22 preferably has a square shape (second square shape). The third moving direction and the fourth moving direction of the second membrane are preferably parallel to the second diagonal line 25 of the square (second square). Furthermore, the shape of the first aperture 12 and the shape of the second aperture 22 are preferably equal.

Further, a distance of movement of the first membrane 10 and a distance of movement of the second membrane 20 is preferably equal (substantially equal), so that the center positions of the patterns are not shifted. If the position of optical axis A of the electron beam B is adjusted in advance so that the position of optical axis A may be the center position of the pattern, it is possible to change the diameter of the electron beam B without changing optical axis A of the electron beam B. This can be achieved, for example, by using a driver which will be described later.

Next, the effects of present embodiment will be described.

In scanning electron microscope, a beam is irradiated on the target object surface and the beam is scanned, and images are formed using the intensities of secondary electrons, back scattering electrons, and reflected electrons obtained by the detector to perform observations.

Figure 5A:
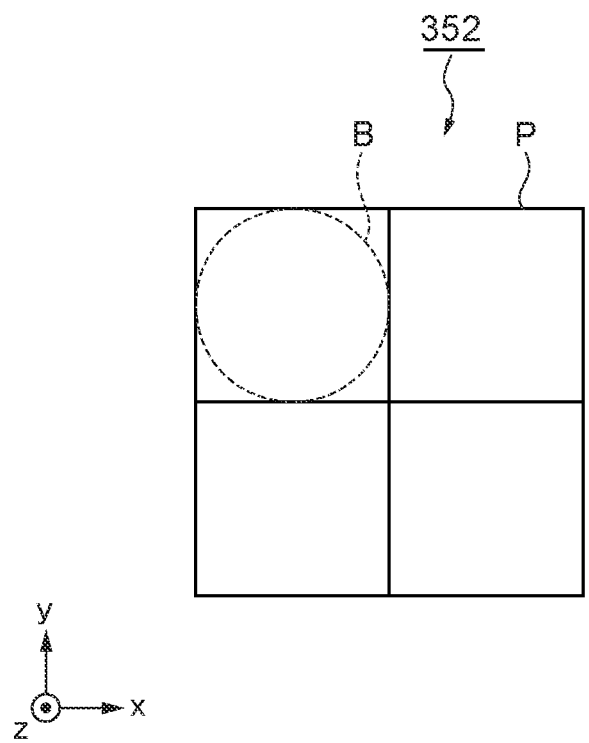
FIG. 5A-B are schematic diagrams for explaining a method of acquiring images using a scanning electron microscope in the first embodiment.
Figure 5B:
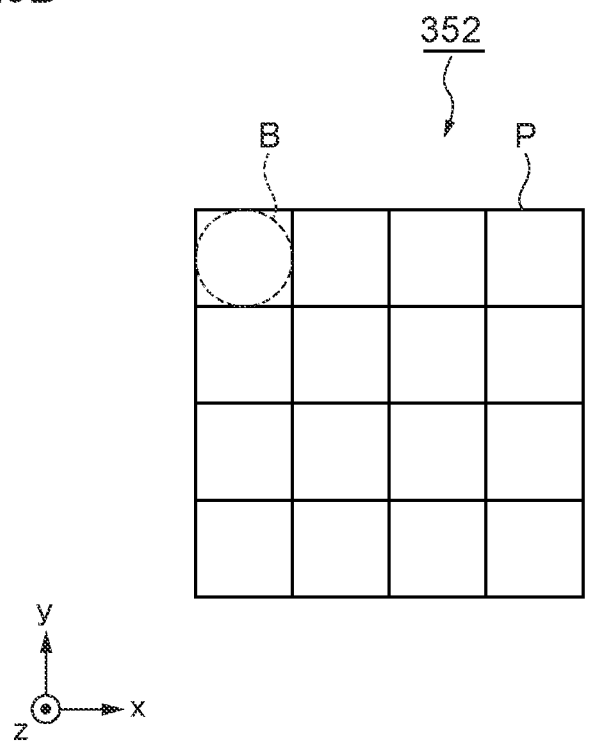

FIG. 5A-B are schematic diagrams for explaining how to acquire images by the scanning electron microscopy 300 of the present embodiment. The observation area 352 on the surface of the target object 350 (FIG. 1) is delimited into meshes, as in FIG. 5A and FIG. 5B. Each square (rectangular) unit is a pixel. The electron beam B is irradiated to the observation area 352, and the secondary electron intensity obtained by the detector 360 is recorded for each pixel using a computer (not shown) in FIG. 1, for example, connected to the detector 360. Observed images of the target object can be obtained by scanning the electron beam B to move it to neighboring pixels and recording the secondary electron intensity repeatedly.

FIG. 5B shows the case when the beam diameter of the electron beam is reduced. The pixel size is decreased according to the beam diameter.

As shown in FIG. 5B, if the beam diameter of the electron beam B can be reduced and the pixel can be reduced, the resolution of the observed image can be increased. However, it takes time to observe. In order to observe the micropattern formed on the surface of the target object 350, such an observation technique is preferable.

On the other hand, as shown in FIG. 5A, if the beam diameter of the electron beam B is increased and the pixel can be increased, the observation can be performed in a short time. However, the resolution of the observed image is reduced. In order to observe large-sized patterns formed on the surface of the target object 350, such an observation technique is preferable.

Thus, there is a trade-off between the beam diameter of the electron beam B and the observation time of the target object.

Generally, the pattern provided on the surface of the target object 350 is not necessarily a single pattern. The pattern provided on the surface of the target object 350 has, for example, both a relatively fine pattern and a relatively large pattern. The observation time can be shortened if the beam diameter of the electron beam B can be selected appropriately according to the pattern type, if the beam diameter of the electron beam B is a large beam diameter in a relatively large pattern and a small beam diameter in a relatively small pattern.

Here, it is considered that the beam diameter of the electron beam B is changed by using the aperture plate 370 as shown in FIG. 2. If you change to any of the aperture 374, the position of aperture 374 is adjusted so that optical axis A does not shift. Such position adjustment is performed, for example, as follows. The stage is moved so that the electron beam B hits Faraday cup 369 provided on the stage on which target object 350 illustrated in FIG. 1 is placed, and the center axis is aligned by changing the position of the aperture plate 370 so that the beam current quantity of the electron beam B is maximized. In addition, astigmatism is adjusted. Since such adjustment takes time, changing the beam diameter of the electron beam B is a time consuming work.

In the aperture of the comparative example shown in FIG. 2, the change of the beam diameter of the electron beam B takes time as described above. Therefore, for example, the target object 350 is observed under the condition that the beam diameter of the electron beam B is selected so as to be suitable for observing a fine pattern. However, in this case, it takes more time compared with the case of observing by changing the beam diameter of the electron beam B in accordance with the size of the pattern.

Therefore, the shaping aperture array for the charged particle beam apparatus of the present embodiment includes a first membrane including a first aperture and a second membrane including a second aperture and arranged so that second aperture overlaps the first aperture as shown in FIG. 3A-B. Also, the first membrane moves in the second direction and the second membrane moves in the fourth direction opposite to the second direction. For example, the second aperture 22 is installed above the first aperture 12, and by a portion of the first aperture 12 and a portion of the second aperture 22 overlapped each other, the third aperture 24 is formed. Optical axis A of the electron beam B is adjusted to pass through the center of the third aperture 24.

When changing the beam diameter, the first membrane 10 is moved in the first direction and the second membrane 20 is moved in the third direction opposite to the first direction. Further, a distance of movement of the first membrane 10 and a distance of movement of the second membrane 20 are preferably equal (substantially equal). As a result, even if the beam diameter is changed, the formed electron beam pattern is set so that the optical axis A comes at the center of aperture formed by apertures of the two membranes.

If the distance of movement of the first membrane 10 and the distance of movement of the second membrane 20 can be accurately made equal to each other, the adjustment of the position of optical axis A can be eliminated. If the accuracy of the adjustment is poor, it is preferable to move the stage so that the beams enter the position of Faraday cup 369 to adjust the position of optical axis. Since there is approximately optical axis A in the center, it can be adjusted in a short time. Therefore, it is possible to shorten the time for adjusting the position of optical axis A with the change of the beam diameter of the electron beam B. Subsequent aberration adjustment can also be performed in a short time.

If the electron beam pattern formed as described above is adjusted so that optical axis A is positioned at the center of aperture formed by the apertures of the two membranes in advance, the change in the position of optical axis A can be reduced. Further, if the distance of movement of the first membrane 10 and the distance of movement of the second membrane 20 is precisely made equal to each other, it is not necessary to adjust the position of optical axis A. Therefore, it is possible to shorten the time for adjusting the position of optical axis A with the change of the beam diameter of the electron beam B. Subsequent aberration adjustment can also be performed in a short time.

Since the beam adjustment time can be shortened by the beam diameter changing method of the present application, the beam diameter can be easily changed according to the observation pattern, and the observation time as a whole can be shortened.

Further, the beam diameter of the electron beam B that can be formed using the aperture plate 370 shown in the comparative example in FIG. 2, the beam diameters are three types, corresponding to the diameter of the aperture 374a, the aperture 374b and the aperture 374c. However, in the case of the shaping aperture array for the charged particle beam apparatus of the present embodiment, the beam diameter can be arbitrarily changed within the size of the first aperture 12 and the size of the second aperture 22.

In the present embodiment, the charged particle beam apparatus using a single (one) electron beam B, referring to the scanning electron microscope 300, has been described above. Inspection apparatus utilizing the electron beam B is an application and a modification of such an electron microscope. The inspection apparatus is used to inspect defects in semiconductor wafers, masks (photomasks) used for exposure in semiconductor device fabrication processes, or liquid crystal displays. As methods of inspection in order to compare the observed image with an image of a normal portion, there are an inspection method (Die to database inspection) in which an image generated from design data is compared with an observed image, and the one (Die to Die inspection) in which a comparison is performed between images of chips formed on a semiconductor wafer, which is mainly performed when there are a plurality of chips having the same shape as the semiconductor wafer inspection. By these inspection methods, a defect site is detected.

In the inspection apparatus as well, the first membrane including the first aperture and the second membrane including the second aperture as shown in FIG. 3A-B can be used to vary the beam diameter. As shown in FIG. 4A-B, the two membranes are placed up and down so that the second aperture overlaps with the first aperture. Also, the first membrane moves in the second direction and the second membrane moves in the fourth direction opposite to the second direction. A portion of the first aperture 12 and a portion of the second aperture 22 overlap each other to form the third aperture 24, such as in FIG. 4A. Optical axis A of the electron beam B is adjusted to pass through the center of the third aperture 24.

When changing the beam diameter, the first membrane 10 is moved in the first direction and the second membrane 20 is moved in the third direction opposite to the first direction. Further, a distance of movement of the first membrane 10 and a distance of movement of the second membrane 20 are preferably equal (substantially equal).

As a result, even if the beam diameter is changed, the formed electron beam pattern is set so that the optical axis A comes at the center of aperture formed by apertures of the two membranes. If the distance of movement of the first membrane and the distance of movement of the second membrane 20 can be accurately made equal to each other, the adjustment of the position of optical axis A can be eliminated. If the accuracy of the adjustment is poor, it is preferable to move the stage so that the beams enter the position of the Faraday cup 369 to adjust the position of optical axis. Since there is approximately optical axis A in the center, it can be adjusted in a short time. Therefore, it is possible to shorten the time for adjusting the position of optical axis A with the change of the beam diameter of the electron beam B. Subsequent aberration adjustment can also be shortened.

As a result, if the electron beam pattern is adjusted in advance so that optical axis is positioned at the center of aperture formed by the apertures of the two membranes, the change in the position of optical axis A can be reduced. Further, if the distance of movement of the first membrane 10 and the distance of movement of the second membrane 20 is accurately made equal to each other, it is not necessary to adjust the position of optical axis A. Therefore, it is possible to shorten the time for adjusting the position of optical axis A with the change of the beam diameter of the electron beam B. Subsequent aberration adjustment can also be shortened.

As mentioned in the section on microscope, inspection apparatus also has a trade-off between resolution performance and inspection time.

If the beam diameter is increased as shown in FIG. 5A, and the specimen is irradiated with the electron beam in the large pixel unit, and the image is acquired and inspected, the inspection is finished in a short time. However, high resolution performance of the inspection image cannot be obtained. On the other hand, if the beam diameter is narrowed down and inspected in small pixel units as in FIG. 5B, the inspection image obtained can be high resolution, but the inspection time becomes longer. Thus, there is a trade-off between beam diameter and inspection time. Therefore, the beam diameter setting according to the inspection pattern is important to inspect the desired pattern in as short a time as possible.

Generally, the pattern inspected by inspection apparatus is not a uniform pattern but includes various patterns. For example, the pattern to be inspected is divided into an array portion including a fine pattern, and a peripheral circuit portion having relatively large dimensions in general for exchanging voltage and signals for controlling the devices included in the fine pattern or the like. In such a case, it is preferable that the inspection is performed in units of small pixels by reducing the beam diameter of the electron beam B in the array portion including the fine pattern, and the inspection is performed in units of large pixels by increasing the beam diameter of the electron beam B in the peripheral circuit portion. This is because inspection of an appropriate resolution can be performed in a short time.

However, when changing the beam diameter of the electron beam B using the aperture plate 370 of comparative example as shown in FIG. 2, optical axis A of the electron beam B is also shifted. Since it takes time to adjust the position of optical axis A, changing the beam diameter of the electron beam B is a time-consuming task. Therefore, for example, the inspection is performed by selecting the beam diameter of the electron beam B so as to be suitable for observation of fine patterns. However, in this case, it takes more time compared with the case of inspecting by changing the beam diameter of the electron beam B in accordance with the size of the pattern.

Further, the beam diameter of the electron beam B that can be formed using the aperture plate 370 shown in the comparative example in FIG. 2, the beam diameters are three types, corresponding to the diameter of the aperture 374a, the aperture 374b and the aperture 374c. However, in the case of the shaping aperture array for the charged particle beam apparatus of the present embodiment, the beam diameter can be arbitrarily changed within the size of the first aperture 12 and the size of the second aperture 22.

When the shaping aperture array for the charged particle beam apparatus of the present embodiment is used, it is possible to shorten the time for adjusting the position of optical axis A in conjunction with the change in the beam diameter of the electron beam B. Therefore, it is possible to easily change the beam diameter at the array portion and the peripheral circuit portion including a fine pattern. Therefore, inspection of an appropriate resolution can be performed in a short time. In addition, since the aperture diameter can be arbitrarily changed in the present application, when there is a portion having a medium size, inspection can be performed by changing the beam diameter of the electron beam B in accordance with the portion having the medium size. As described above, the variable aperture of the present application can arbitrarily change aperture diameter and the pixels of the inspection in accordance with the dimensions of the pattern-under-test, and can shorten the inspection times.

The shaping aperture array for the charged particle beam apparatus of the present embodiment is an application of the scanning electron microscope 300, and can be used for mask drawing apparatus and wafer drawing apparatus using a single (one) electron beam B as a modification.

The electron beam B is scanned and irradiated on the target object surface by the deflecting electrode, which is similar to the case of the electron microscope. At this time, the beam is turned on and off using the blanking electrode. In addition, the stage is moved so that the beam is illuminated. These are repeated to form a pattern on the target object surface.

During mask drawing and wafer drawing, the photoresist (resist) at the position where the electron beam B is exposed on the surface of the target object 350 is irradiated. A pattern of the photoresist is formed by the subsequent baking and developing steps of mask drawing and wafer drawing. By scanning the electron beam B, a desired pattern can be formed.

In the drawing apparatus as well, the first membrane with the first aperture and the second membrane with the second aperture as shown in FIG. 3A-B can be used to vary the beam diameter. As shown in FIG. 4A-B, the two membranes are placed up and down so that the second aperture overlaps the first aperture. Also, the first membrane moves in the second direction and the second membrane moves in the fourth direction opposite to the second direction. A portion of the first aperture 12 and a portion of the second aperture 22 overlap each other to form the third aperture 24, such as shown in FIG. 4A. Optical axis A of the electron beam B is adjusted to pass through the center of the third aperture 24.

When changing the beam diameter, the first membrane 10 is moved in the first direction and the second membrane 20 is moved in the third direction opposite to the first direction. Further, the distance of the movement of the first membrane 10 and the distance of the movement of the second membrane 20 are preferably equal (substantially equal).

As a result, even if the beam diameter is changed, the formed electron beam pattern is set so that the optical axis A comes at the center of aperture formed by apertures of the two membranes. If the distance of movement of the first membrane 10 and the distance of movement of the second membrane 20 can be accurately made equal to each other, the adjustment of the position of optical axis A can be eliminated. If the accuracy of the adjustment is poor, it is preferable to move the stage so that the beams enter the position of the Faraday cup to adjust the position of optical axis. Since there is approximately optical axis A in the center, it can be adjusted in a short time. Therefore, it is possible to shorten the time for adjusting the position of optical axis A with the change of the beam diameter of the electron beam B. Subsequent aberration adjustment can also be shortened.

As mentioned in the section on the microscope, the drawing apparatus also has a trade-off between resolution performance and drawing times.

If the beam diameter is increased as shown in FIG. 5A and the resist is irradiated with the electron beam in units of large pixels, the drawing is finished in a short time. However, high resolution is not obtained. On the other hand, if the beam diameter is narrowed down and the drawing is performed in units of small pixels, as in FIG. 5B, the resolution performance is obtained, but the drawing time becomes longer. Thus, the beam diameter and the drawing time have a trade-off relationship. Therefore, the beam diameter setting according to the drawing pattern is important to draw the desired pattern in as short a time as possible.

Generally, the pattern formed on the surface of the target object 350 is not uniform. For example, the pattern to be drawn is divided into an array portion including a fine pattern, and a peripheral circuit portion having relatively large dimensions in general for exchanging voltages and signals for controlling the devices included in the fine pattern or the like. In order to perform the drawing in a short time, it is preferable to perform the drawing in small pixel units by reducing the beam diameter of the electron beam B in the array portion including the fine pattern, and to perform the drawing in large pixel units by increasing the beam diameter of the electron beam B in the peripheral circuit portion.

Here, the beam diameter of the electron beam B is adjusted, using the aperture plate 370 as shown the comparative example in FIG. 2, by moving the stage so that the electron beam B hits the Faraday cup provided on the stage where target object 350 is placed, the position of the aperture plate 370 is adjusted to align the central axis of the electron beam B, and the astigmatism is adjusted. Since such position adjustment takes time, changing the beam diameter of the electron beam B is a time consuming work. Therefore, for example, the drawing is performed by selecting the beam diameter of the electron beam B so as to be suitable for observation of fine patterns. However, in this case, it takes more time compared with the case of inspecting by changing the beam diameter of the electron beam B in accordance with the size of the pattern.

When the method of the present application is used, the beam diameter is changed so as to fix the center positions of the two apertures corresponding to the central axis of the beam. When the control accuracy of membrane position is high, the beam diameter can be changed according to the pattern type, and therefore, for example, the array portion can be drawn by changing the beam diameter to 30 nm, and, without moving the stage, the beam diameter is changed to 100 nm, for example, and the drawing can be performed in a large pixel unit. In addition, even when membrane position can not be controlled to such a high level, since the deviation of the central axis is small, even when the normal beam adjustment is performed, the beam diameter can be changed in a short time. Although adjusting two types of beam diameter are described here, in the present application, the beam diameters can be arbitrarily changed as long as the aperture plate can be operated. On the other hand, only three types of beam diameters can be used in the comparative example shown in FIG. 2. Therefore, in the present application, when various patterns are included, a plurality of beam diameters can be changed according to the pattern size. Therefore, by dividing the drawing pattern area, it is possible to set the beam diameter which is suitable for pattern dimension, it is possible to shorten the drawing time.

FIG. 6 to FIG. 11 are schematic diagrams showing a method of changing the diameter of the electron beam B using the first membrane and the second membrane in a modification of the present embodiment.

Figure 6A:
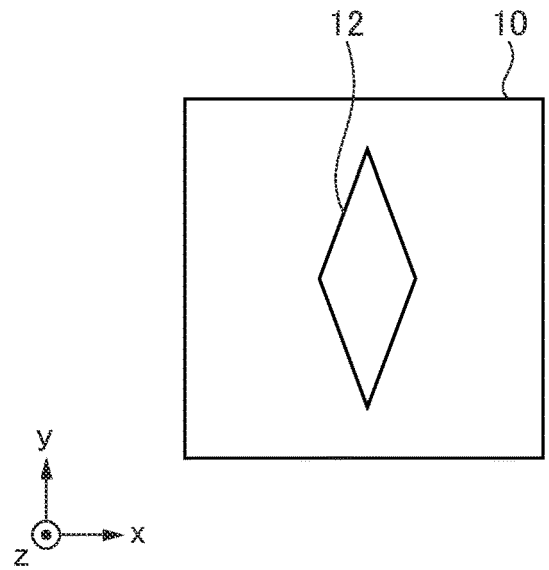
FIG. 6A-B are schematic diagrams illustrating a method of changing the diameter of an electron beam B using the first membrane and the second membrane in a modification of the first embodiment.
Figure 6B:
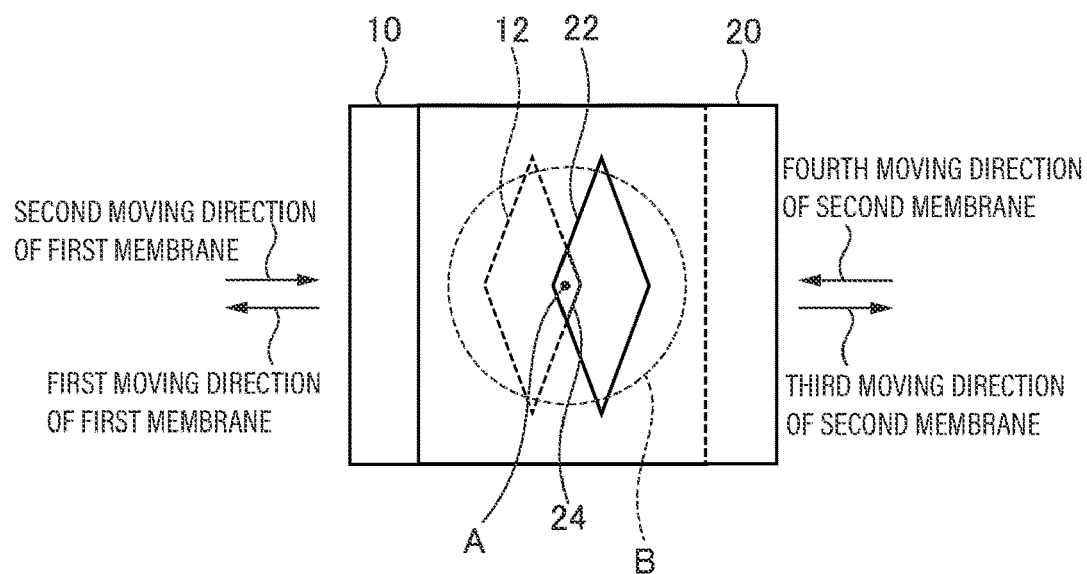

In the above example, the aperture is a square, as an example. However, the aperture is not limited to a square. For example, as shown in FIG. 6A-B, the aperture may have a diamond shape. FIG. 6A shows the aperture of one aperture. When two apertures are overlapped as in FIG. 6B, the common aperture has also a diamond shape. The size of the diamond shape can be changed by moving it in the width direction by substantially the same distance, without moving the center of the diamond shape. Therefore, it is possible to change only the size of the beam without moving the axis of the beam.

Figure 7A:
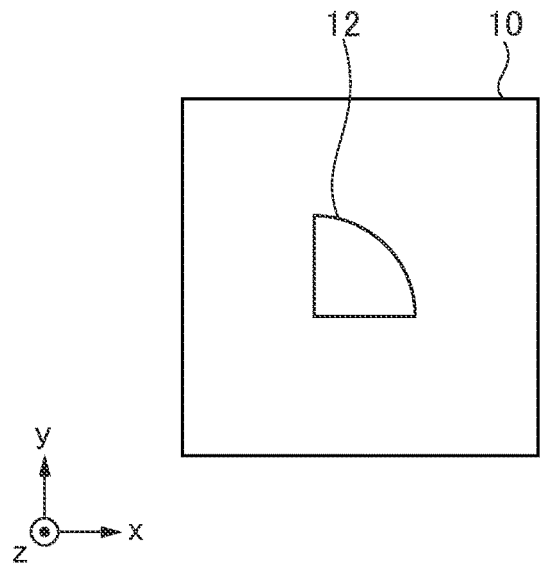
FIG. 7A-B are schematic diagrams illustrating a method of changing the diameter of an electron beam B using the first membrane and the second membrane in a modification of the first embodiment.
Figure 7B:
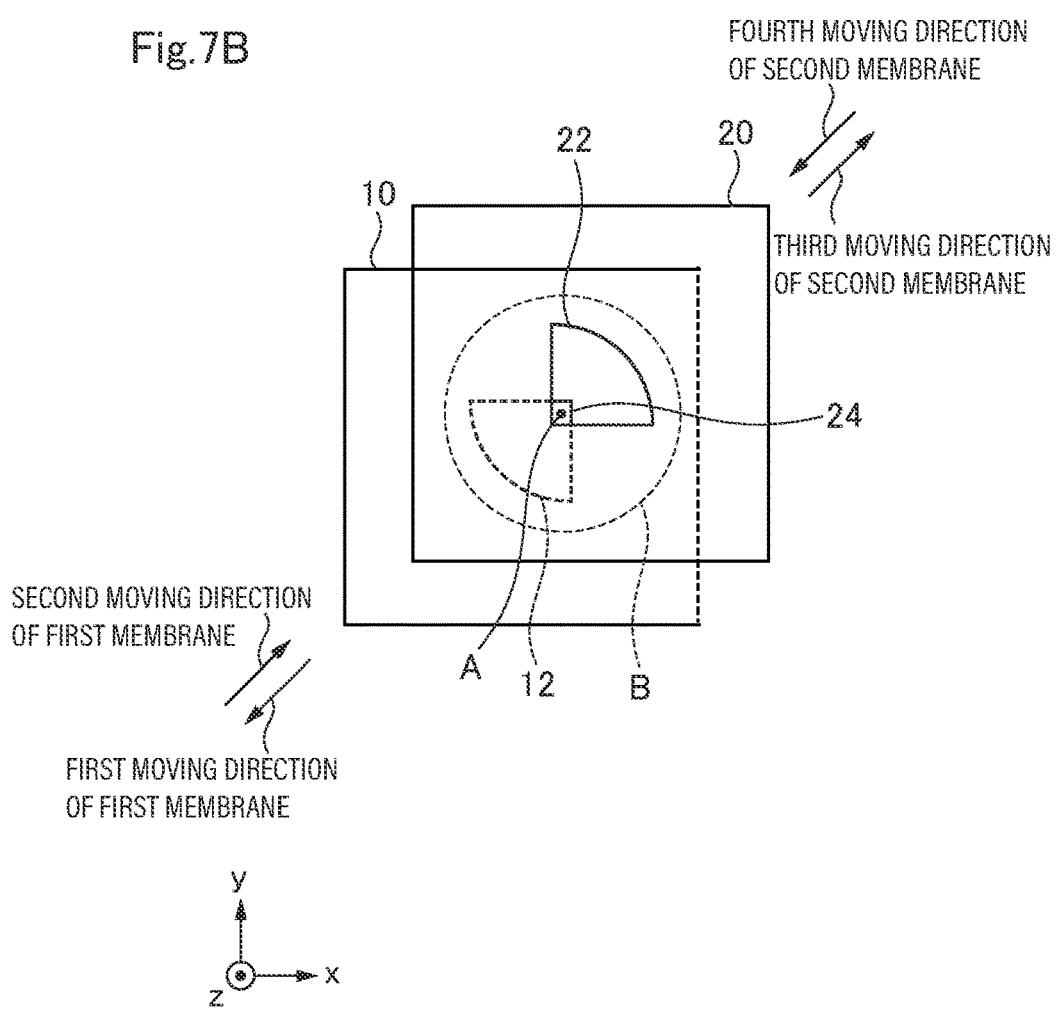
Figure 8A:
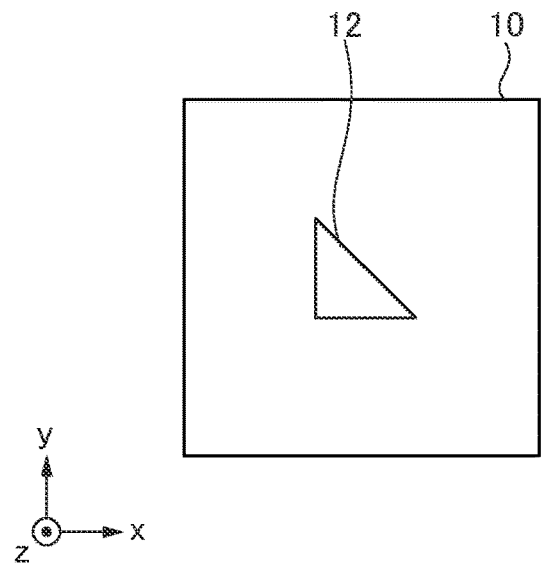
FIG. 8A-B are schematic diagrams illustrating a method of changing the diameter of an electron beam B using the first membrane and the second membrane in a modification of the first embodiment.
Figure 8B:
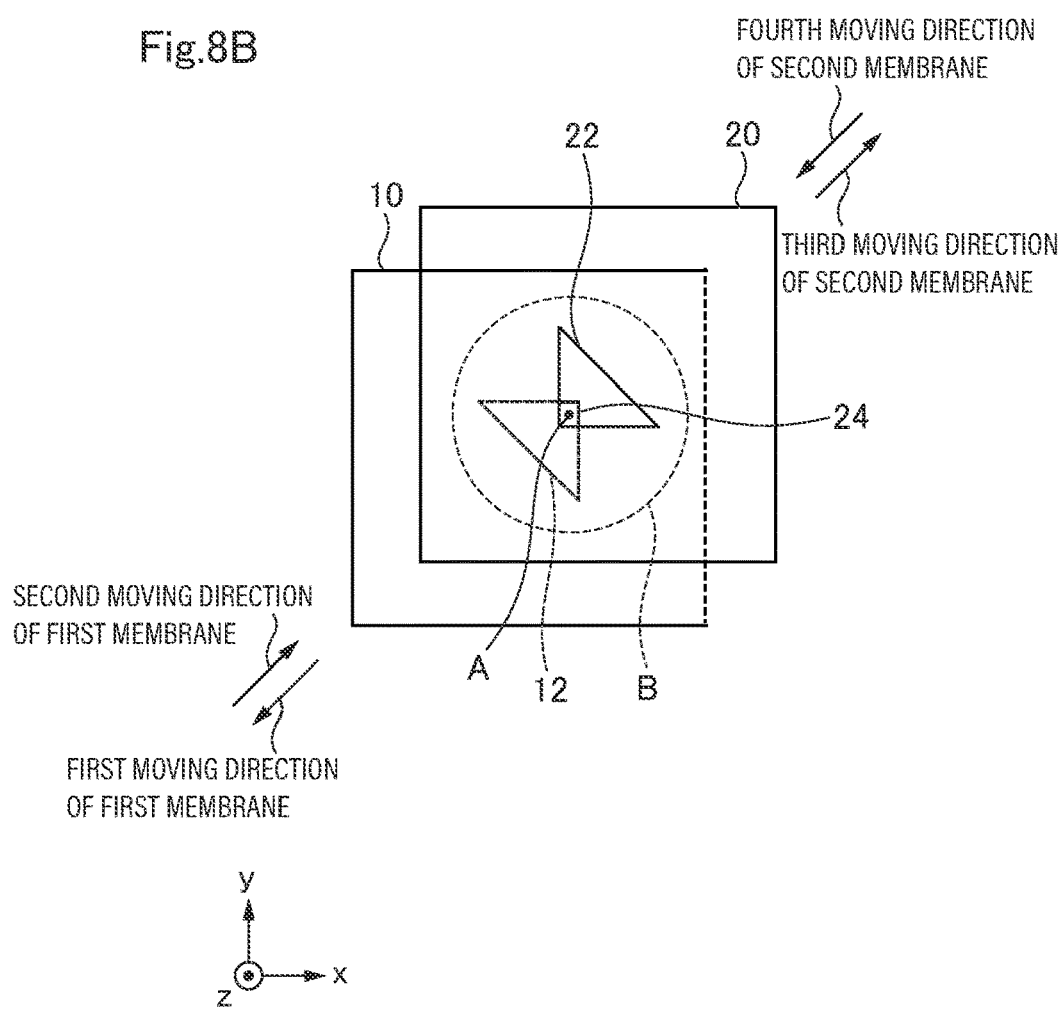

In addition, when a beam is formed using an aperture having a square as described above, the square corners of the aperture, i.e. the two sides of the squares, are used to form the beam. Thus, the shape of other portions not used for forming the beam is not limited. For example, even in a sector shape as shown in FIG. 7A-B, a square common aperture portion can be formed. By moving the beam diagonally at substantially the same distance, the beam diameter can be changed without moving the center of the square of the common aperture, and the axis of the beam with the beam diameter change is maintained. Similarly, a triangular aperture shown in FIG. 8A-B can achieve the same effect.

Figure 10:
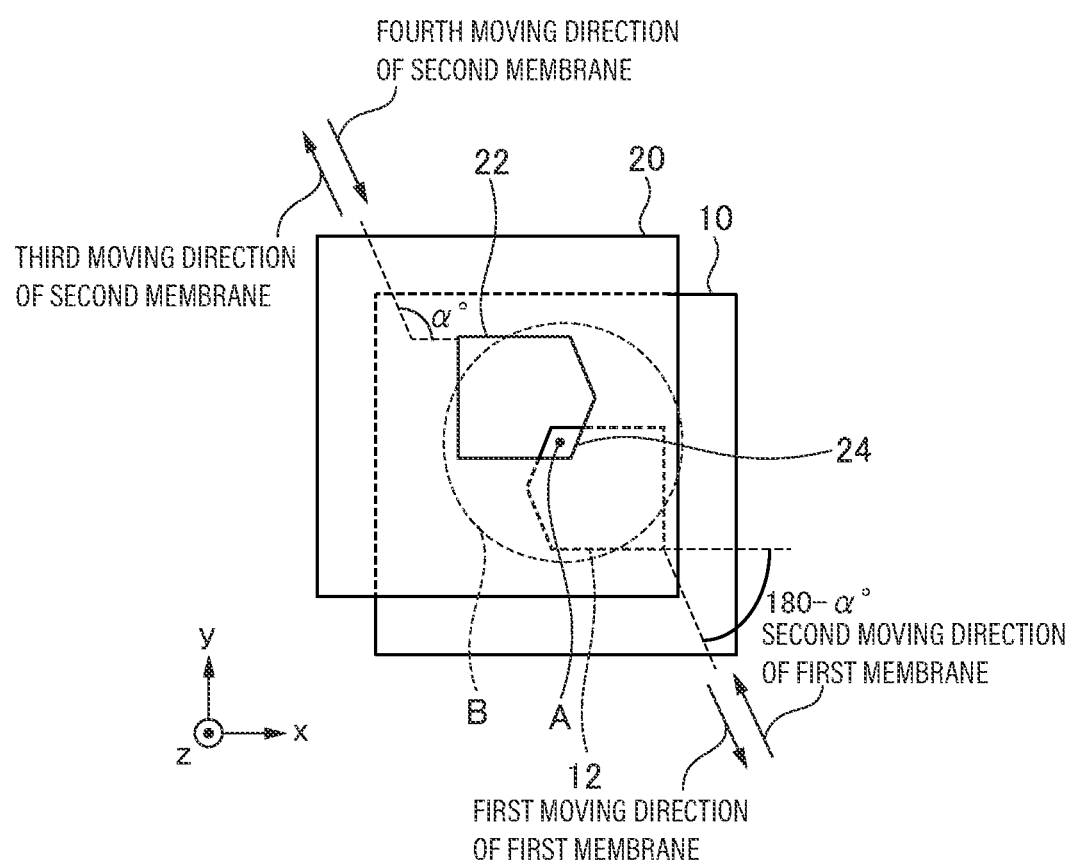
FIG. 10 is a schematic diagram illustrating a method of changing the diameter of an electron beam B using the first membrane and the second membrane in a modification of the first embodiment.

Furthermore, two apertures may form a plurality of shapes instead of one. Examples are shown in FIG. 9A-C and FIG. 10. Two types of apertures can be formed using the aperture shown in FIG. 9A. A square aperture can be formed by using the corners of a 90° angled aperture, each with two sides (FIG. 9 B). Also, diamond-shaped beams can be formed by using aperture angles that are not 90° (FIG. 9 C) In addition, the upper and lower portions can be overlapped to form parallelogram beams (FIG. 10). In this case, the direction of movement of the two apertures with respect to the angle α shown in FIG. 9A is the direction of α and 180°-α with respect to the upper surface of the aperture. If α is 120°, the two apertures are moved in 120° direction and 60° direction. In this case, a parallelogram with angles of 120° and 60° can be formed. If α is 135°, the two apertures are moved in 135° direction and 45° direction. In this case, a parallelogram with angles of 135° and 45° can be formed. In both cases, changing the size of the common aperture does not move the center of the pattern. The beam size can be changed without changing the beam axis if the axis is adjusted so that the axis is at the center of the common aperture.

Although the examples in which the apertures having the apertures of same shape have been used is shown, the apertures having the apertures of different shape may be used. Examples are shown in FIG. 11A-D. Here, two apertures (FIG. 11A, FIG. 11B) having square apertures of differing sizes are overlapped. FIG. 11C shows the case when one corner and two sides are used to form a common aperture of the square. As in the previous example, by moving in an oblique direction, the size of the beam can be changed without changing the axis of the beam. FIG. 11D consists of three sides of a small square pattern and one side of a large square to form a common aperture of a rectangle. Two apertures can be moved in the width direction to form a rectangular aperture. Dimensional variations due to misalignment can be suppressed by the two apertures with the different sizes, although a common aperture of similar rectangles can be formed with two apertures of the same size Here, a large square is taken as an example, but the same effect can be obtained even if the upper and lower sides of the rectangle are longer than the left and right sides, instead of using the large square.

In the above, the methods of combining two apertures to form an electron beam pattern using a common aperture have been described. However, the number of apertures may be three or more. When a pattern formed of two membranes is used as one pattern in the above example, the same effect can be obtained.

According to the shaping aperture array for charged particle beam apparatus and the charged particle beam apparatus of the present embodiment, the shaping aperture array for the charged particle beam apparatus and the charged particle beam apparatus which can reduce the adjusting times associated with changing beam diameters and to optimize viewing, checking, and drawing times, can be provided.

Second Embodiment

In the second embodiment, an example in which multi-electron beams are used will be described.

The shaping aperture array plate for the charged particle beam apparatus of the present embodiment is different from that of the first embodiment in that the first element include a plurality of first apertures and the second element includes a plurality of second apertures. The charged particle beam apparatus of the present embodiment is different from that of the first embodiment in that it is a multi charged particle beam apparatus.

By irradiating a large number of beams with one shot, and by moving the stage, pattern formation, observation, and inspection are continuously performed. Since a large number of beams can be irradiated in one shot, both miniaturization of the beam and shortening the time of exposure, inspection, and observation can be achieved, which leads to an improvement in throughput. (For example, Non-Patent Document 1, H. Yasuda et. al.: Jpn. J. Appl. Phys. 32 (1993) 6012.)

First, multi-electron beam drawing apparatus will be described.

Figure 13:
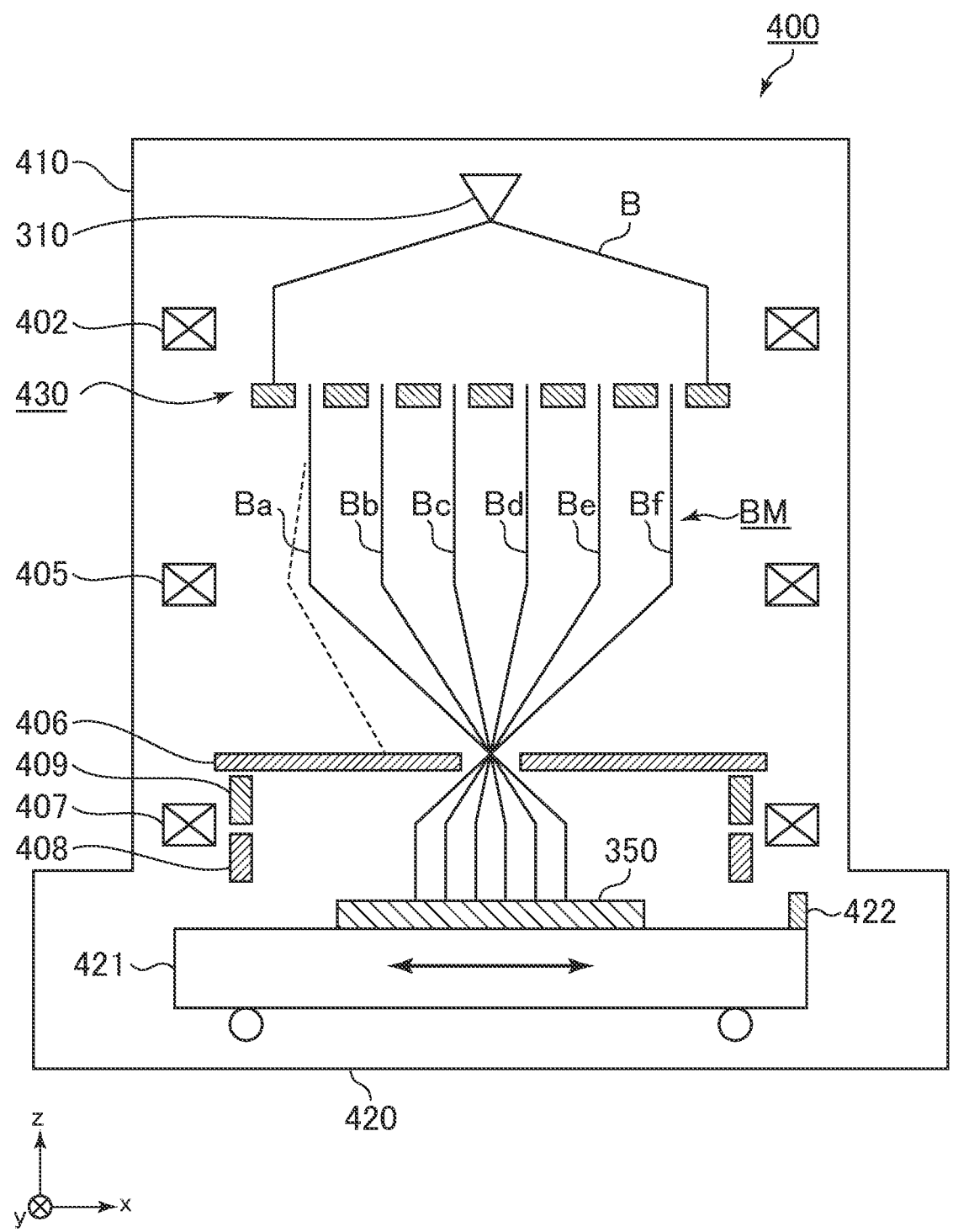
FIG. 13 is a schematic cross-sectional view of multi-electron beams drawing apparatus of a second embodiment.

FIG. 13 is schematic cross-sectional view of multi-electron beam drawing apparatus 400 of the present embodiment.

The electron beam emitted from the electron gun is projected onto a multi aperture system (430) including a plurality of apertures to form multi-beams. The multi aperture system 430 includes a mechanism for deflecting the electron beam, the deflected beam is deflected like a dotted line of Ba shown in FIG. 13 and is shielded by the limiting aperture member 406 so that it cannot reach the target object 350. The beam that passes through the shielded aperture member without being deflected is collected and reduced, and the multi-electron beam is irradiated on the target object surface. A resist is applied to the target object 350 on the stage, and the position irradiated with the electron beam is exposed to the electron beam, and a resist pattern is formed by a subsequent baking and developing process, so that a desired pattern can be formed.

The detailed configuration of the equipment shown in FIG. 13 is shown below.

The shaping aperture array plate 110 (described in FIG. 15 and FIG. 16) for charged particle beam apparatus of the present embodiment is, for example, a part of the multi aperture array system 430 of multi-electron beam drawing apparatus 400 and is used as the shaping aperture array plate for the charged particle beam apparatus.

Multi-electron beam drawing apparatus 400 has an electron optical column 410 (multi electron beam column) and a drawing room 420. Within electron optical column 410 the electron gun 310, the illumination lens 402, the multi aperture system 430, the reduction lens 405, the limiting aperture member 406, the objective lens 407, the main deflector 408, and the sub-deflector 409 are installed.

The electron beam B emitted from the electron gun 310 illuminates the multi aperture system 430 almost perpendicularly by the illumination lens 402. Then, the electron beam B passes through the aperture of the multi aperture system 430, and multi-beams BM are formed. Multi-beams BMs have electron beam Ba, Bb, Bc, Bd, Be and Bf. The shape of the respective electron beam B reflects the shape of the aperture, i.e. for example, a rectangular shape or a square shape, of the shaping aperture array plate 110 for the charged particle beam apparatus included in the multi aperture system 430. Although the apertures of multi aperture system 430 shown are six in FIG. 13, the number of apertures is not limited thereto. Six multi-beams BMs formed by the multi aperture system 430 are shown in FIG. 13. However, the number of multi-beams BMs formed is not limited, in some cases tens of thousands.

The blanking aperture array (BAA) plate (460a, 460b of FIG. 17A-B) is included in the multi-beam aperture system 430 and is provided below shaping aperture array plate for the charged particle beam apparatus (110 of FIG. 15 and FIG. 16, 450 of FIG. 17 A-B). Multi-beams BMs deflected by the blanking aperture array plate (460a, 460b in FIG. 17A-B) are displaced from the bore at the center of the limiting aperture member 406 and are shielded by the limiting aperture member 406. On the other hand, the undeflected multi-beams passes through a bore in the center of the limiting aperture member 406. This controls the on/off of multi-beams BMs.

Multi-beams BMs passing through the limiting aperture member 406 are focused by the objective lens 407 to produce a pattern image of the desired reduction ratio and are collectively deflected by the main deflector 408 and the sub-deflector 409. Then, the respective irradiation positions on the target object 350 placed on the stages 421 are irradiated. Further, a mirror 422 for measuring the position of the stage 421 is disposed on the stage 421.

Multi aperture system includes several plates and has a mechanism to determine the beam diameter and a mechanism to deflect the beam to determine the beam on/off. Furthermore, plates having various functions are combined. The examples will be described in FIG. 17A-B later.

Figure 14:
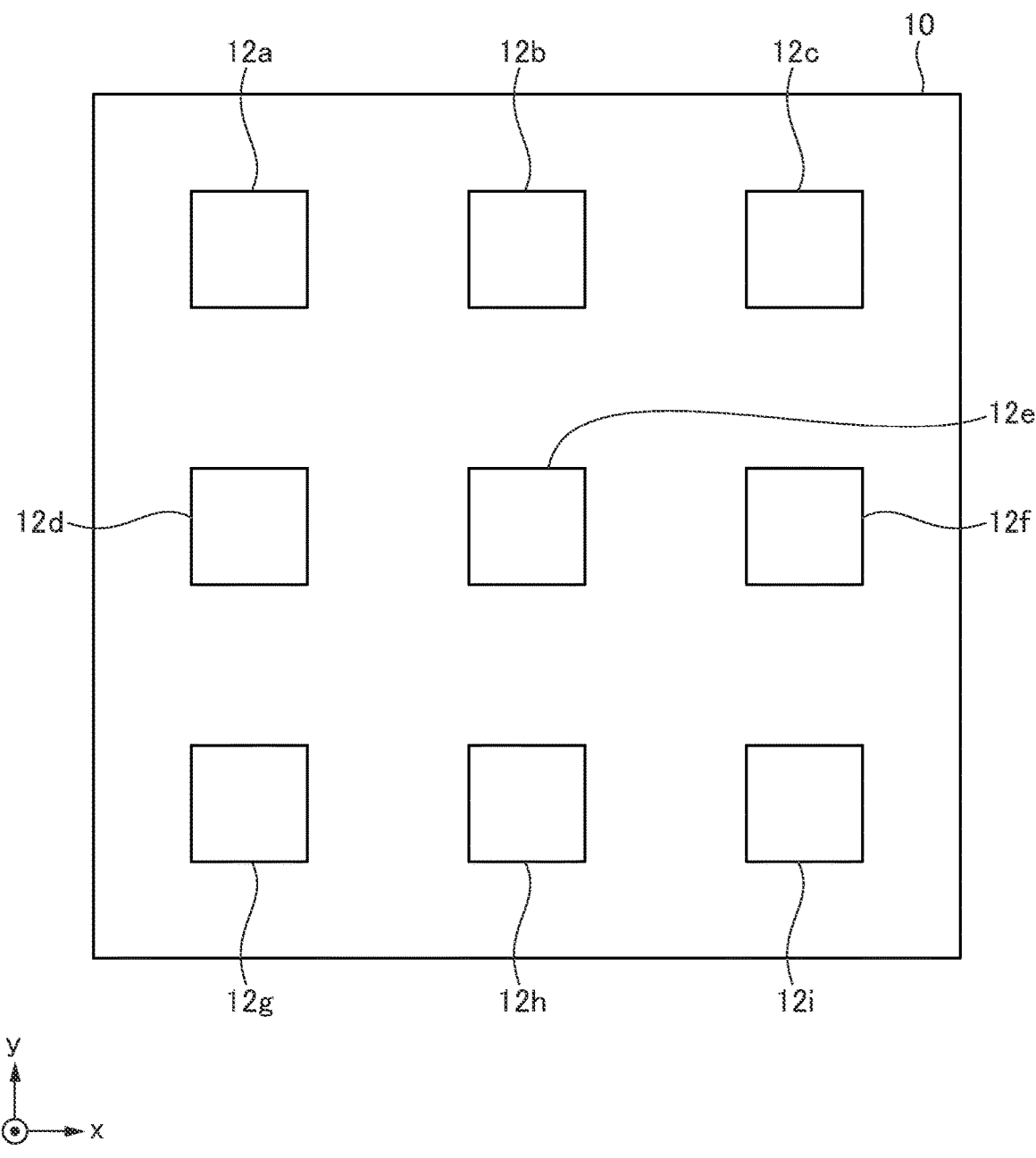
FIG. 14 is a schematic top view of first membrane used in a shaping aperture array for charged particle beam apparatus of the second embodiment.

First, the shaping aperture array plate for the charged particle beam apparatus 110 of the present embodiment is described. The shaping aperture array plate includes two membranes, and FIG. 14 is a schematic top view of the one first membrane 10 of them. The first membrane 10 has a plurality of first apertures 12. The first apertures 12a, 12b and 12c are arranged in the X-direction. The first apertures 12d, 12e and 12f are arranged in the X-direction. The first apertures 12 g, 12h and 12i are arranged in the X-direction. The first apertures 12a, 12d, and 12g are arranged in the Y-direction. The first apertures 12b, 12e and 12h are arranged in the Y-direction. The first aperture 12c, 12f and 12i are arranged in the Y-direction. Several apertures are arranged in a fixed cycle in this way in the X-direction and the Y-direction.

Figure 15:
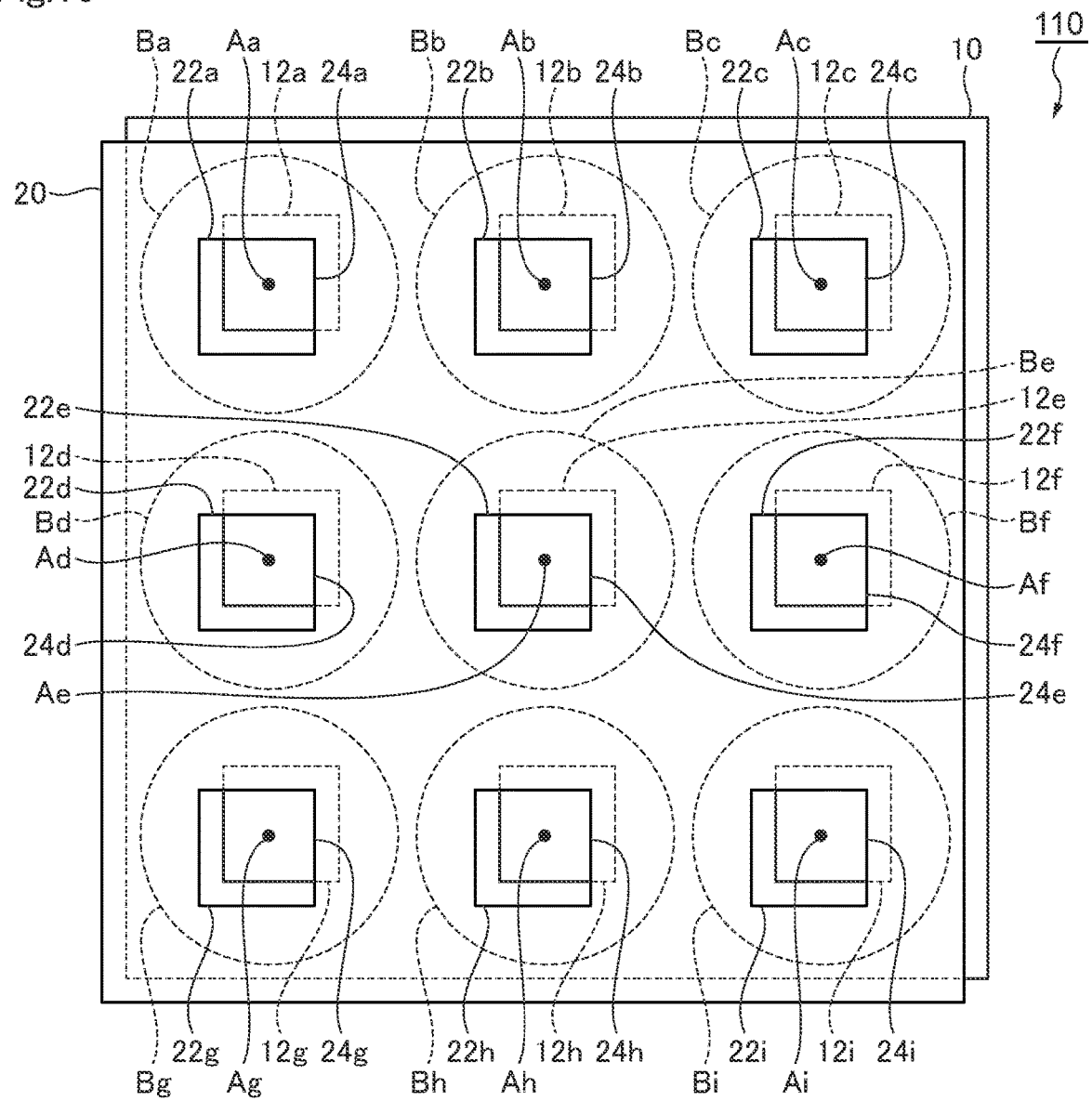
FIG. 15 is a schematic diagram illustrating a method of changing a diameter of an electron beam B using the first membrane and the second membrane 20 of the second embodiment.
Figure 16:
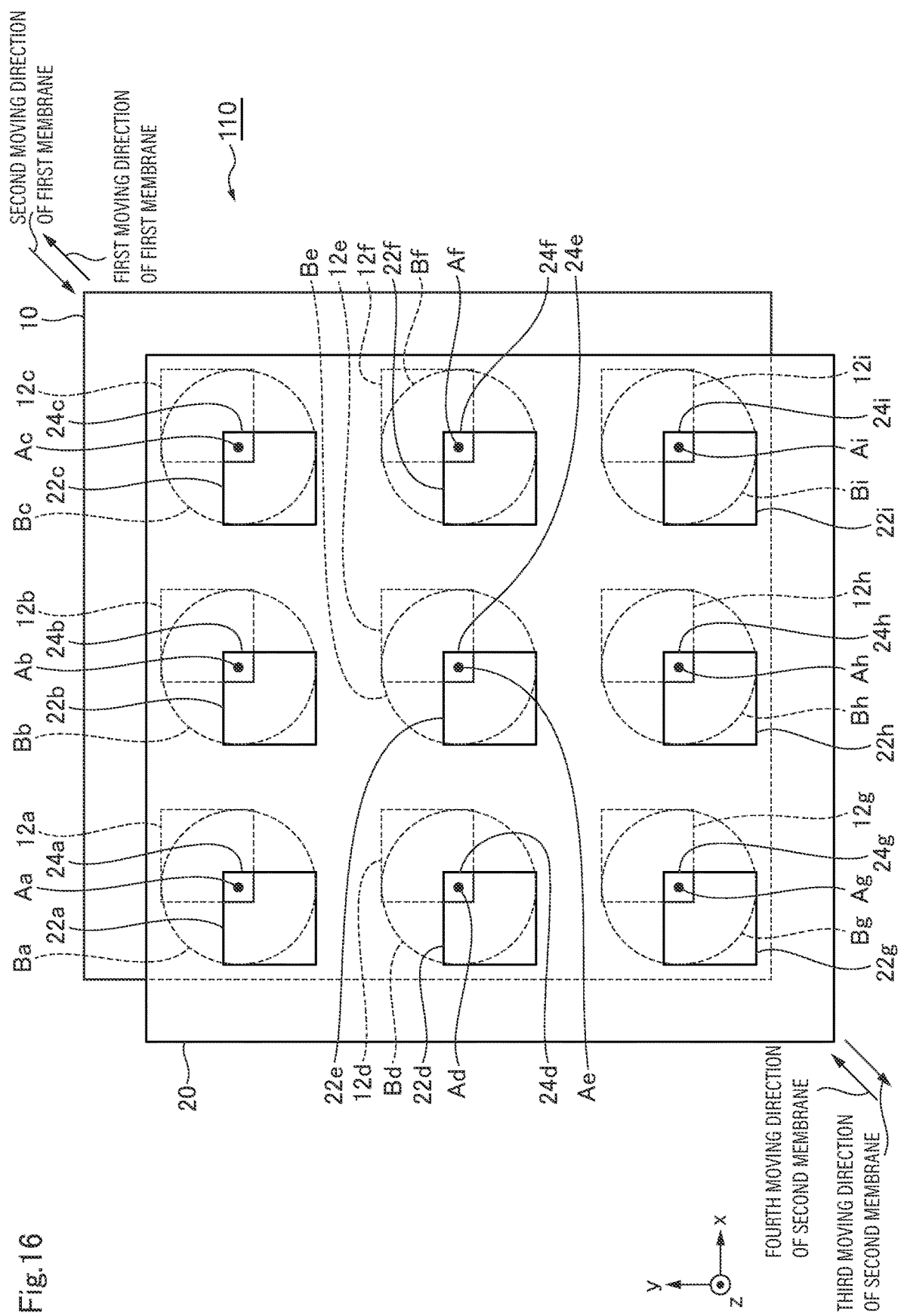
FIG. 16 is a schematic diagram illustrating a method of changing a diameter of an electron beam B using the first membrane and the second membrane 20 in the second embodiment.

FIG. 15 and FIG. 16 are schematic diagrams showing how to change the diameter of the electron beam B using the first membrane 10 and the second membrane 20 in the present embodiment. Here, it is assumed that first membrane 10 and the second membrane 20 have similar structures.

In FIG. 15, it is shown that portions of the first apertures 12a, 12b, 12c, 12d, 12e, 12f, 12g, 12h and 12i and portions of the second apertures 22a, 22b, 22c, 22d, 22e, 22f, 22g, 22h and 22i overlap each other to provide the third apertures 24a, 24b, 24c, 24d, 24e, 24f, 24g, 24h and 24i. Optical axis Aa, Ab, Ac, Ad, Ae, Af, Ag, Ah and Ai of the electron beam B are adjusted to pass through the centers of the third apertures 24a, 24b, 24c, 24d, 24e, 24f, 24g, 24h and 24i, respectively. When the electron beam B is irradiated, the electron beam B passes through the third aperture 24. Therefore, the electron beam B having a diameter corresponding to the size of the third apertures 24 in a plane parallel to the XY plane is formed.

In FIG. 16, the first membrane 10 and the second membrane 20 are moved in mutually opposite directions in a plane parallel to the XY plane to reduce the size of the third apertures 24 in a plane parallel to the XY plane. In this way, the size of the third aperture 24 can be reduced by, for example, moving the first membrane 10 in the first moving direction and moving the second membrane 20 in the third moving direction opposite to the first moving direction. In such cases, the diameter of the electron beam B formed by passing through the third apertures 24 is smaller than that in FIG. 15.

By moving the first membrane 10 in the second moving direction opposite to the first moving direction and moving the second membrane 20 in the fourth moving direction opposite to the third moving direction, the size of the third aperture 24 in the plane parallel to the XY-plane can be increased. Thus, the diameter of the electron beam B formed by passing through the third aperture 24 is larger than that of FIG. 16.

Further, if the center of the aperture is adjusted to come to optical axis of the electron beam in advance, the center position of the pattern is not shifted by making the distance of movement of the first membrane 10 and the distance of movement of the second membrane 20 equal (substantially equal) to each other. That is, without changing optical axis A of the electron beam B, it is possible to change the diameter of the electron beam B. This can be achieved, for example, by using a driver which will be described later.

FIG. 19A-B shows a comparative example for multi-beams. (e.g., U.S. Pat. No. 8,546,767, which is Patent Document 1) In this case, two types of apertures having different sizes are periodically arranged. To increase the beam diameter, the larger aperture is adjusted to the beam trajectory. The center of the beam is indicated by a point in the figure (FIG. 19A). On the other hand, when reducing the beam diameter, the aperture plate is moved to the left of the arrow shown in the figure so that the smaller aperture enters the beam trajectory (FIG. 19B).

In the modified comparative example, optical axis is shifted when the beam diameter is changed because the aperture plate is moved. Therefore, it is preferable to adjust the position of the aperture plate while observing the change in the current when the electron beam is irradiated after the stage is moved to the Faraday cup position. Thus it takes a long time to change the beam diameter. On the other hand, in the present application, since the electron beam diameter can be changed without changing optical axis, it is possible to shorten the beam diameter changing time.

In addition, in the present application, since the beam pattern is formed by changing the position of the membranes, the beam diameter can be arbitrarily changed within the size of the apertures, and there is no limit on the beam diameter that can be changed. On the other hand, in the comparative example, since the area of the aperture plate is limited, there is a limitation on the number of the aperture types that can be arranged.

As described in the single-beam embodiment of Example 1, in the multi-beams drawing apparatus, the resolution performance and drawing times are also in a trade-off relation.

Figure 20:
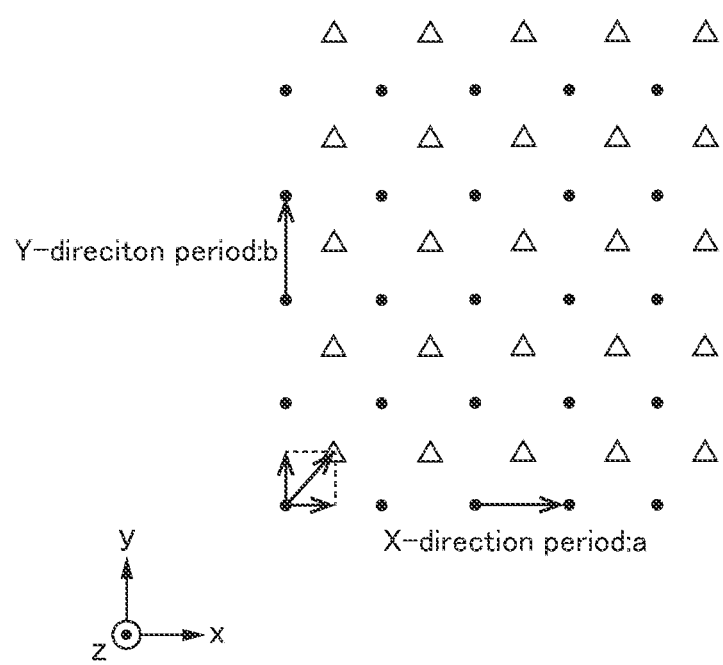
FIG. 20 is an explanation of a method for narrowing the irradiation interval by shifting the beam irradiation position in the multiple drawing of the second embodiment.

Unlike a single beam, the beam irradiation interval is determined by a multi-beam aperture plate. However, since the multiple drawing in which the electron beam is irradiated multiple times can be performed, the same effect as decreasing the pixel size can be obtained by shifting the stage position by an integer fraction of the period of multi-beams in accordance with the number of times the electron beam is irradiated. FIG. 20 shows an example. FIG. 20 shows drawing two times in which the beam-irradiated position is shifted by one-half of multi-beams period. The first beam is irradiated to the black circle position, and the second beam is irradiated to the triangle position shifted by ½ of multi-beams cycle in both the X-direction and Y-direction. Since multi-beams has a $\sqrt{(a^2+b^2)}/2$ interval, it can be expected to have higher resolutions than a single drawing. Further, it is also possible to perform drawing four times by adding a drawing shifted by ½ of the period in the X-direction and a drawing shifted by ½ of the period only in the Y-direction. In this situation, multi-beams radiation interval is half of that of the multi-beam aperture period, so even higher resolution can be expected. By performing the drawing shifted by 1/n of the period in this way, $n^2$ drawing can be performed, the exposure interval can be narrowed, and the same effect as reducing the pixel size can be obtained. On the other hand, when multiple drawing is performed, it is preferable to reduce the beam diameter in order to change the current amount in accordance with the photosensitive performance of the resist to be used in comparison with the single drawing. In comparison with the single drawing, in the multiple drawing, the drawing time becomes longer. As described above, the resolution performance and the drawing time have a trade-off relationship.

Therefore, it is preferable to optimize the drawing time by matching the beam irradiation interval, dose, and beam diameter according to the drawing pattern.

Generally, the pattern formed on the surface of target object 350 is not uniform. For example, the pattern to be drawn is divided into an array portion including a fine pattern, and a peripheral circuit portion having relatively large size dimensions in general for exchanging voltage and signals for controlling the devices or the like included in the fine pattern. In order to perform drawing in a short time, it is preferable that the beam diameter of the electron beam B is reduced in the array portion including the fine pattern, and multiple drawing is performed by shifting the beam irradiation position by short interval, and in the peripheral circuit portion, multiple drawing is performed in which the beam diameter of the electron beam B is increased and the beam irradiation position is shifted by large interval, or a single drawing is performed.

In the comparative example, after drawing is performed by reducing the beam diameter and narrowing the beam irradiation interval for the array portion (the aperture plate is at the position of FIG. 19B), when the peripheral circuit unit is drawn, the aperture plate is moved to the position of FIG. 19A so as to increase the beam diameter and the stage is moved to the Faraday cup mounted on the stage to make the electron beam enter, and the current value is adjusted to be maximized. Therefore, after drawing the array portion with a beam having a diameter of 30 nm, by moving the position of the aperture plate, for example, a beam having a diameter of 100 nm is produced. At this time, since the central axis of the beam is shifted, the stage is moved so that the beam is irradiated to the position of the Faraday cup mounted on the stage. The position of the aperture plate is adjusted in this position to align the central axis. Further, the astigmatism is adjusted. After that, the drawing of the peripheral circuit portion can be started.

Normally, this process is time-consuming, so electron beam drawing is often performed with the beam diameter adjusted to match the finest pattern.

With the methods of the present application, the beam diameter is changed by moving two membranes at substantially the same distance in the opposite direction. Therefore, the beam diameter can be changed by fixing the center position of the common aperture corresponding to the center axis of the beam. When the control accuracy of membrane position is high, the beam diameter can be changed according to the pattern type, and therefore, for example, the arraying portion can be drawn by changing the beam diameter to 30 nm, and, without moving the stage, the beam diameter is changed to 100 nm, for example, and the drawing can be performed in a large pixel unit. In addition, even if the membrane position can not be controlled to such a high level, since the deviation of the central axis is small, the beam diameter can be changed in a short time even if the normal beam adjustment is performed.

Although two types of beam diameter adjustment are described here, when various patterns are included, a plurality of beam diameter changes are also possible according to the pattern size, so that the drawing pattern area can be divided to set a beam diameter having a pattern dimension, thereby shortening the drawing time.

In the above description, a plurality of apertures is described as squares. However, as shown in FIG. 6 to FIG. 8 in the single-beam section of the first embodiment, the aperture is not limited to a square even in multi-beams. The apertures may be a plurality of diamonds, triangles, and sectors that are arranged. Further, as shown in FIG. 9A-C and FIG. 10, a plurality of apertures forming a plurality of shapes using two aperture plate may be arranged. Furthermore, as shown in FIG. 11A-D, the shapes of a plurality of apertures arranged in two aperture plates may be different. A plurality of different aperture patterns may be prepared in the aperture plate, and a required pattern may be selected and used. For multi-beams, it is preferable that the apertures be arranged periodically. Although the apertures are arranged in the 90° direction in the above, they may be arranged periodically and shifted at a constant angle. In addition, an example in which the apertures are arranged in the same period both in the X-direction and the Y-direction are described above, however, the period may not be the same.

Figure 17A:
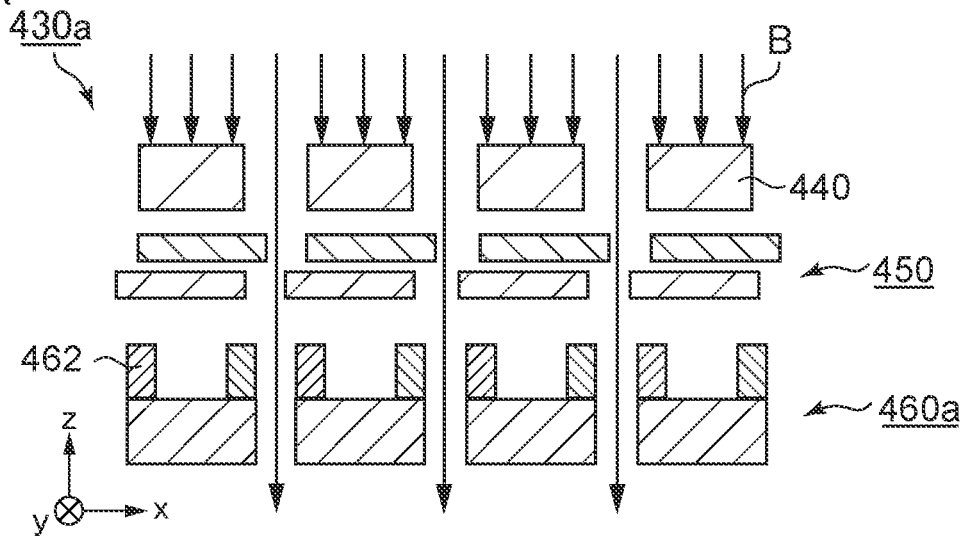
FIG. 17A-B are schematic cross-sectional views of a multi aperture system in the second embodiment.

Next, FIG. 17A shows the use of the shaping aperture array plate 110 in the multi aperture system 430 of the present application. A first plate 440 is a cover plate to prevent direct exposure of X-rays and scattered electrons to the blanking array aperture (BAA) 460. The first plate 440 serves as a beam stopper to stop electrons, and a large number of electrons are irradiated. There is also a role of preventing X-rays generated by scattered electrons and electron irradiations from entering the aperture system. The first plate 440 is exposed to a large number of electrons and X-rays and can become hot and deformed. Therefore, the shapes and diameters of the beams are determined by the following aperture. The shaping aperture array plate (a variable aperture plate 450) of the present application is used for the aperture for determining the beam shape diameter. The variable aperture plate 450 including two membranes (corresponding to the shaping aperture array plate 110 shown in FIGS. 15 and 16) is inserted between the BAA 460 and the first plate 440. The two membranes can change the size of the common aperture by fixing the center of the common aperture while moving the two membranes in the opposite direction. This allows the electron beam passing through the plate 1 to be shaped. The BAA460 (a second plate) then controls the passage of the beams and turns them on/off.

Figure 18A:
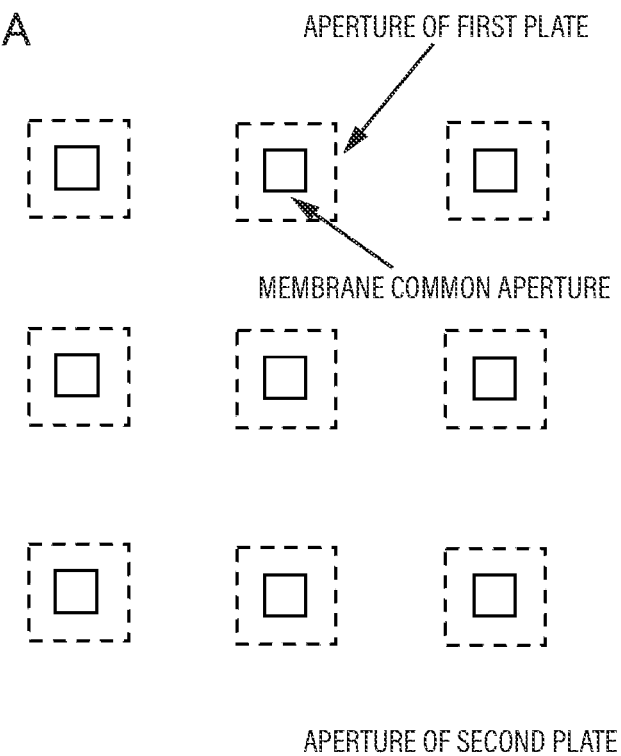
FIG. 18A-B are schematic top views indicating the size of apertures (opening portions, openings) of the respective plates in the second embodiment.
Figure 18B:
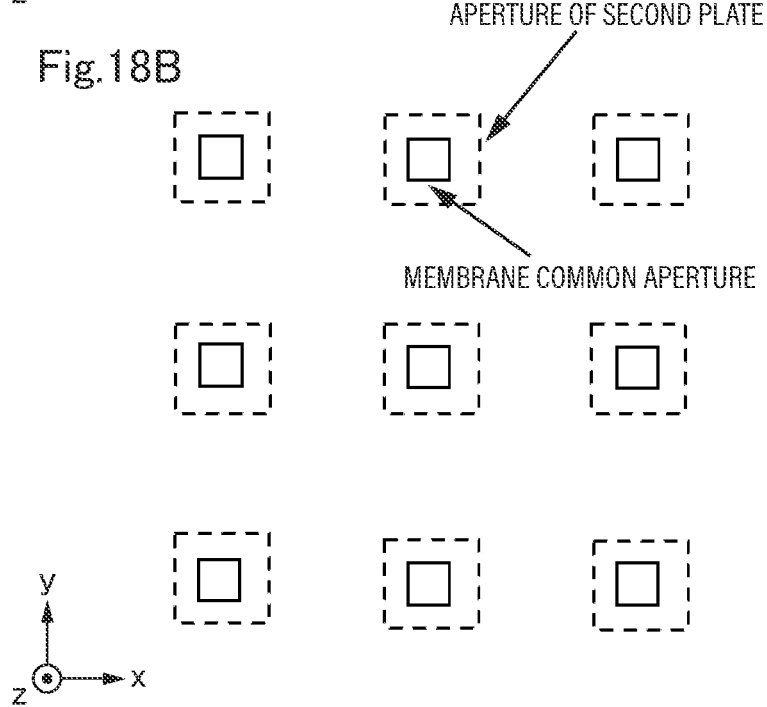

FIG. 18A-B indicates the size of the apertures of the plates. Since the beams are shaped by the membrane common aperture, the aperture of the first plate 440 is larger than that of the membrane common aperture (common aperture formed of the two membranes). In addition, the aperture of the BAA460 (second plate) is designed to be larger than the membrane common aperture because it also passes deflected beams.

Figure 17B:
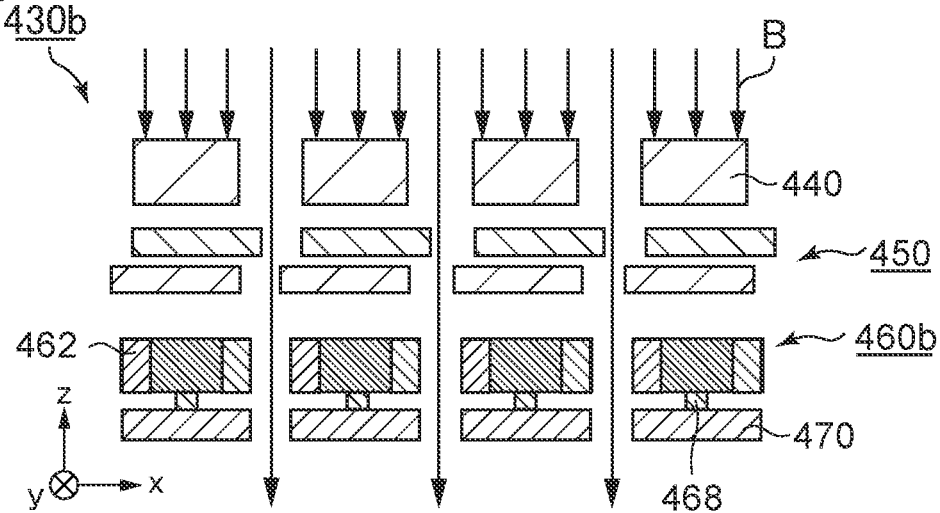

FIG. 17B is a modification of the multi aperture system (multi aperture system 430b). In this case, an electrode 462 of the BAA460b is formed on the side surface, and the aperture plate 470 is disposed after the beamforming. A third plate 470 is an electrode for removing an effect of an electric field of a neighboring aperture when voltage is applied to the electrode of the blanking aperture (for crosstalk prevention). In this case, the aperture of the third plate 470 is larger than the diameter of the beam forming aperture and is designed to have an aperture diameter through which the beams deflected by the BAA460b also pass. The third plate 470 is bonded to the BAA460b by the bonding metal 468. Multi aperture system is not limited thereto. But, the beam shaping aperture array plate of the present application is an aperture plate that controls the beam diameter and the shape and is combined with the aperture plate having various roles as described above to form a multi aperture system.

Defect inspection apparatus in wafers and masks are also becoming increasingly the apparatus using multi-beams.

In the first embodiment, a single beam is used to observe the target object surface. Based on this, a defect inspection is performed. The defect inspection apparatus is also becoming increasingly the apparatus using multi-beams. The difference in using multi-beams are, using multi-beams instead of an electron beam to be irradiated for inspection, and using a multi-array detector.

When multi-beams are used, the aperture plate preferably has a plurality of apertures. A variable aperture plate (110 of FIG. 15 and FIG. 16) including two membranes shown in FIG. 14 is used here. As described above, when the two membranes are moved by approximately the same distance in the opposite direction to change the beam diameter, the center position of the common aperture does not change. Optical axis of the beam does not change by setting the center of the common aperture to be optical axis of the electron beam when the beam diameter is changed. This makes it easy to change the beam diameter. In addition, the time required to change the beam diameter can be shortened.

Comparative examples are shown in FIG. 19A-B. The aperture plate is a periodic array of two aperture sizes. FIG. 19A shows the case using large apertures, and FIG. 19B shows the case using small apertures. Both are switched by moving the aperture plate as shown in FIG. 19A. In this situation, optical axis is moved, so optical axis must be adjusted. The stage is moved to the Faraday cup (not shown) installed in a part of the stage of the inspection apparatus and optical axis is adjusted while observing the detected current. Therefore, it takes time to change the beam diameter.

By reducing the beam diameter, the resolution is improved, but the intensity of the image detected by the detector is reduced. Therefore, it is preferable to increase the number of times the image is integrated. Thus, it takes a longer inspection time. Thus, there is a trade-off between the beam diameter and the inspection time.

Further, in order to increase the resolution performance, the resolution performance can also be improved by irradiating the electron beam by shifting the stage position by an integer fraction of a period of the multi-beam aperture array 110 (FIG. 20), as described in the section of multi-beams drawing apparatus and synthesizing the shifted images of the positions obtained in integral numbers. In this case, too, the time for acquiring an image at one location becomes long, and thus the inspection time becomes long.

In the inspection of the target object in which the pattern size varies depending on the region, the inspection is performed by changing the beam diameter for each region. In the present application, since the beam diameter can be easily changed and can be performed in a short time, the inspection time can be shortened while maintaining a desired resolution.

Further, in the present application, as described in the drawing apparatus section, since the beam pattern is formed by displacing the position of the membrane, the beam diameter can be arbitrarily changed within the size of the aperture, and there is no limit on the beam diameter that can be changed. On the other hand, in the comparative example, since the area of the aperture plate is limited, the number of beam diameters to be arranged is limited. Since the variable aperture of the present application can arbitrarily change the beam diameter, the aperture diameter and pixels of the inspection can be arbitrarily changed according to the dimensions of the pattern-under-test, and thus the inspection times can be shortened.

In inspection apparatus, the object to be inspected can be not only the patterning on the wafer and the liquid crystal display, but also the photomask. The acceleration voltage can be set low, for example, 1 kV or less, to prevent the charge-up. Furthermore, in EUV-mask, since it includes a multilayer mirror made of a low-resistance material such as Mo or Si, it is easy to inspect such mask.

The shaping aperture array for the charged particle beam apparatus and the charged particle beam apparatus of the present embodiment provide the shaping aperture array for the charged particle beam apparatus and the charged particle beam apparatus to reduce the adjusting time associated with changing beam diameters and to optimize observing time, inspecting time, and drawing time.

Next, common items in the first embodiment and the second embodiment will be described.

Figure 12A:
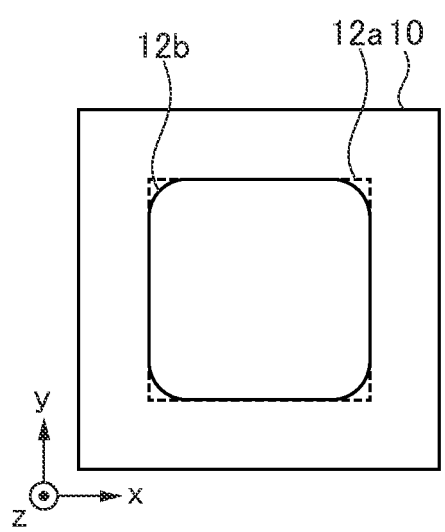
FIG. 12A-B show the relationship between the designed shape of an aperture and the finished geometry.
Figure 12B:
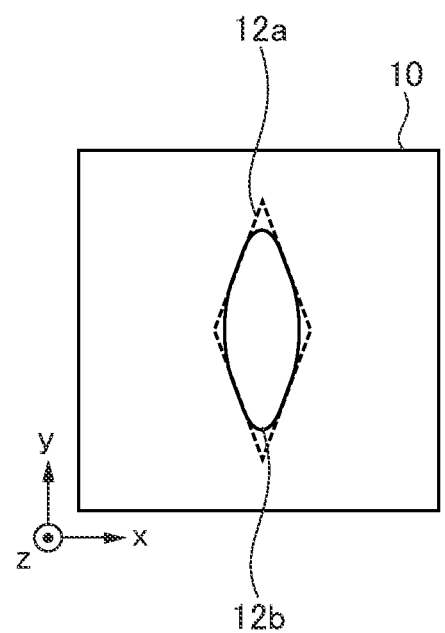

In the above description, the angle of the common aperture is assumed to be an acute angle. However, in practice, the corners of the aperture are typically rounded during processing. FIG. 12A-B shows the relationship between the designed shape of the aperture and the finished geometry. FIG. 12A shows an example of a square and FIG. 12B shows an example of a diamond. The rounding of the corners differs depending on the magnification and processing method at the time of observation, but the corners of the finished pattern are rounded compared to the design pattern in both cases.

The degree of rounding of the corners of the designed and finished dimensions of the aperture pattern depends on the pattern dimension. When the pattern dimension is small, the rounding of the corners becomes remarkable. On the other hand, when the pattern dimension is large, even if there is a rounding of the corners microscopically, the rounding of the corners is not a problem practically.

As the beam spreads after passing through the common aperture, the corners of the beam are also rounded.

For microscope or inspection apparatus, the fine beams are formed using a common square aperture. Circular beams are formed when reaching the target object plane. Since the beam diameter is small, the beam irradiation position, the image of the resulting secondary electrons and reflected electrons can be obtained finely, it is possible to observe the shape or the like.

For the electron beam drawing apparatus, it depends on the pattern dimension. When fine patterns are drawn, fine beams are formed using the common aperture of squares. Circular beams arrive at the target object plane. In the acute-angled portion macroscopically, plurality of fine beams are irradiated to form the acute-angled pattern to the resist formed on the wafer.

When large-sized patterns are formed, the aperture diameter is also large. Though the rounding of the corners at the common aperture exists microscopically, acute-angled pattern can be formed macroscopically. Since the rounding of the beam after passing through the common aperture is also macroscopically small, the resist pattern formed on the wafer can be almost the same as the pattern formed at the common portion. As a result, the resist can be drawn in a short time.

In the present application, by the moving two apertures by the same distance, the beam diameter can be changed without moving the center of the common aperture. However, the distance of the moving and aperture dimensions is subject to errors. Therefore, they cannot be perfectly matched. If the error is within the allowable range, it can be used only by changing the beam diameter as it is. If the error exceeds the allowable range, the beam adjustment is preferred, however, since it is not greatly changed as in the comparative example, it is possible to shorten the beam adjustment time.

The membrane of the shaping aperture of the present application may be formed for single-beam or multi-beams, for example, by forming an aperture on a silicon-based substrate by a MEMS (Micro Electro Mechanical Systems)

process, and forming a metallic film on the surface. Here, MEMS process is a process of manufacturing a predetermined structure by performing patterning or etching or the like by semiconductor process. Further, it is preferable that such a metal film includes, for example, Pt (platinum), Au (gold), W (tungsten), or CrN (chromium nitride), since they are difficult to be oxidized and good conductive characteristics can be obtained. However, the material contained in the metal film is not limited thereto. Further, the membrane may not be a silicon substrate. For example, the membrane may be a thin metal film. Note that the material or the process in which membrane is formed is not particularly limited to the above-described one.

In this example, the embodiment in which the electron beam is used is described. However, the ion beam can be used for the observation and the drawing. The observation or the exposure of the resist can be performed using the beams of low atomic weight ions, such as H ion beam, He ion beam, B ion beam, and Ar ion beam, by manipulating the beam or moving the target object stages, in the same way as the electron beam. In addition, high atomic weight beams such as Ga ions and In ions can be used to fabricate masks and structures on wafers directly. Further, it is also possible to perform a chemical reaction by irradiating the above ions under a gas atmosphere to process a structure on a mask or a wafer.

Third Embodiment

Descriptions of the contents overlapping with the first embodiment and the second embodiment are omitted.

Figure 21:
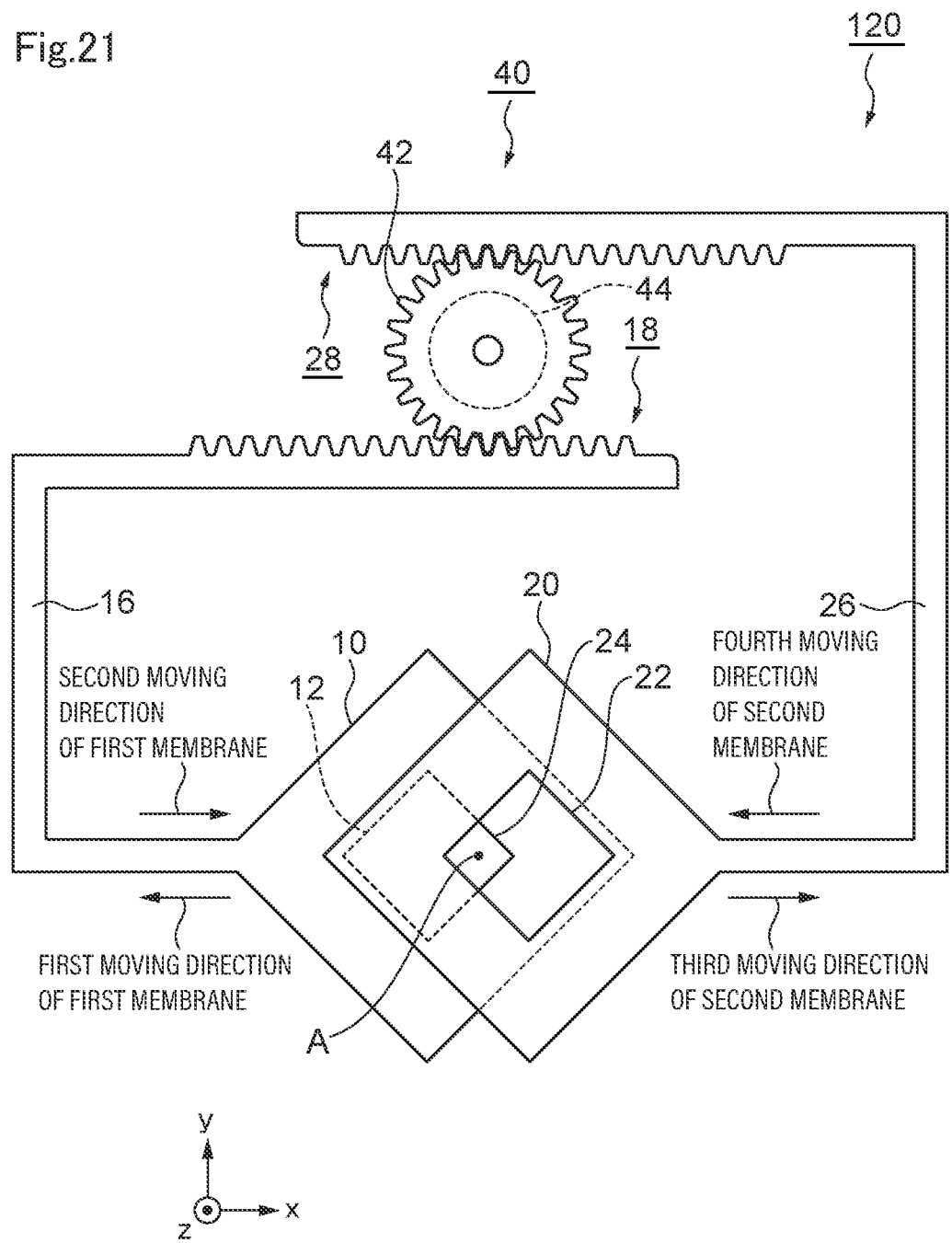
FIG. 21 is a schematic top view of a shaping aperture array for the charged particle beam apparatus of the first aspect of the third embodiment.

FIG. 21 is schematic top view of the shaping aperture array for the charged particle beam apparatus 120 of the first aspect of present embodiment.

The driver of a first aspect of the present embodiment includes a first stepper motor, a first pinion gear connected to the first stepper motor, and the first pinion gear being rotatable in a predetermined plane including the first direction and the second direction, a first rack gear meshed with the first pinion gear, and the first rack gear being capable of moving the first element in the first direction, and a second rack gear meshed with the first pinion gear, and the second rack gear being capable of moving the second element in the second direction.

The driver (driving device) 40 has a first stepper motor 44, a first pinion gear 42 connected to the first stepper motor 44, a first rack gear 18, and a second rack gear 28. The first membrane 10 is connected to a first support (a first rod) 16. The first support 16 includes the first rack gear 18. The second membrane 20 is connected to a second support (a second rod) 26. The second support 26 includes the second rack gear 28. The first pinion gear 42 is rotatable in the XY-plane clockwise or counterclockwise direction by the operation of the first stepper motor 44. The XY plane is an example of the predetermined plane. The first rack gear 18 and the second rack gear 28 are provided so as to mesh with the first pinion gear 42, respectively. Here, the first rack gear 18 and the second rack gear 28 are provided so as to face each other with the first pinion gear 42 in between. In other words, the first pinion gear 42 is provided between the first rack gear 18 and the second rack gear 28 in the XY-plane. Thus, when the first pinion gear 42 rotates clockwise (an example of a first rotational direction), the first membrane 10 moves in the first moving direction and the second membrane 20 moves in the third moving direction. Also, when the first pinion gear 42 rotates counterclockwise (an example of a second rotational direction, and the second rotational direction is opposite to the first rotational direction), the first membrane 10 moves in the second moving direction and the second membrane 20 moves in the fourth moving direction. In FIG. 10, the first rack gear 18 and the second rack gear 28 are facing each other. However, the first rack gear 18 and the second rack gear 28 may not face each other.

Figure 22:
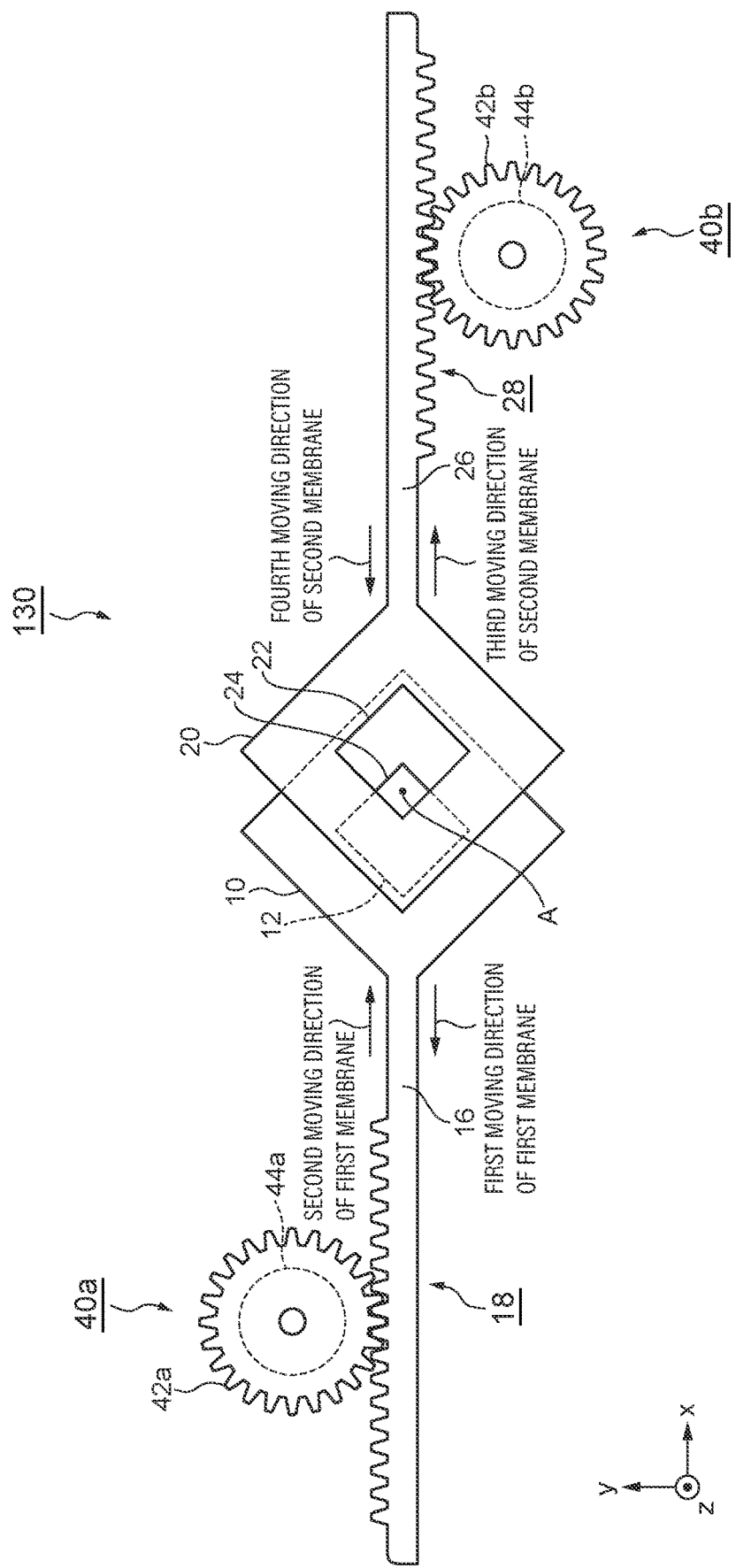
FIG. 22 is a schematic top view of the shaping aperture array for the charged particle beam apparatus of the second aspect of the third embodiment.

FIG. 22 is a schematic top view of the shaping aperture array for the charged particle beam apparatus 130 of the second aspect of the present embodiment.

The driver of a second aspect of the present embodiment includes a first stepper motor, a first pinion gear connected to the first stepper motor, and the first pinion gear being rotatable in a predetermined plane including the first direction and the second direction, a first rack gear meshed with the first pinion gear, and the first rack gear being capable of moving the first membrane in the first direction, a second stepper motor, a second pinion gear connected to the second stepper motor, and the second pinion gear being rotatable in the predetermined plane, and a second rack gear meshed with the second pinion gear, and the second rack gear being capable of moving the second membrane in the second direction.

The driver 130 has a driver 40a and a driver 40b. Here, the driver 40a includes the first stepper motor 44a, the first pinion gear 42a, and the first rack gear 18. The first pinion gear 42a is connected to the first stepper motor 44a. The first pinion gear 42a is rotatable in the XY-plane clockwise or counterclockwise direction by the operation of the first stepper motor 44a. The first membrane 10 is connected to the first support (the first rod) 16. The first support 16 has the first rack gear 18. The first rack gear 18 is provided so as to mesh with the first pinion gear 42a. As a result, when the first pinion gear 42a rotates clockwise, the first membrane 10 moves in the first moving direction. Also, if the first pinion gear 42a rotates counterclockwise, the first membrane 10 moves in the second moving direction.

The driver 40b includes the second stepper motor 44b, the second pinion gear 42b, and the second rack gear 28. The second pinion gear 42b is connected to the second stepper motor 44b. The second pinion gear 42b is rotatable in the XY-plane clockwise or counterclockwise by the operation of the second stepper motor 44b. The second membrane 20 is connected to the second support (second rod) 26. The second support 26 includes a second rack gear 28. The second rack gear 28 is provided so as to mesh with the second pinion gear 42b. As a result, when the second pinion gear 42b rotates clockwise, the second membrane 20 moves in the first moving direction. Also, when the second pinion gear 42b rotates counterclockwise, the second membrane 20 moves in the second moving direction.

The first membrane 10 and the second membrane 20 are provided between the first rack gear 18 and the second rack gear 28. In this case, it is preferable that the first stepper motor 44a and the second stepper motor 44b rotate accurately so that the first membrane 10 and the second membrane 20 move at equal distances opposite to each other.

Incidentally, the first rack gear 18, the first stepper motor 44a and the first pinion gear 42a is provided on the Y-direction side of the first support 16. However, the first rack gear 18, the first stepper motor 44a and the first pinion gear 42a may be provided on the −Y-direction side of the first support 16.

Further, the second rack gear 28, the second stepper motor 44b and the second pinion gear 42b is provided on the −Y-direction side of the second support 26. However, the second rack gear 28, the second stepper motor 44b and the second pinion gear 42b may be provided on the Y-direction side of the second support 26.

Figure 23:
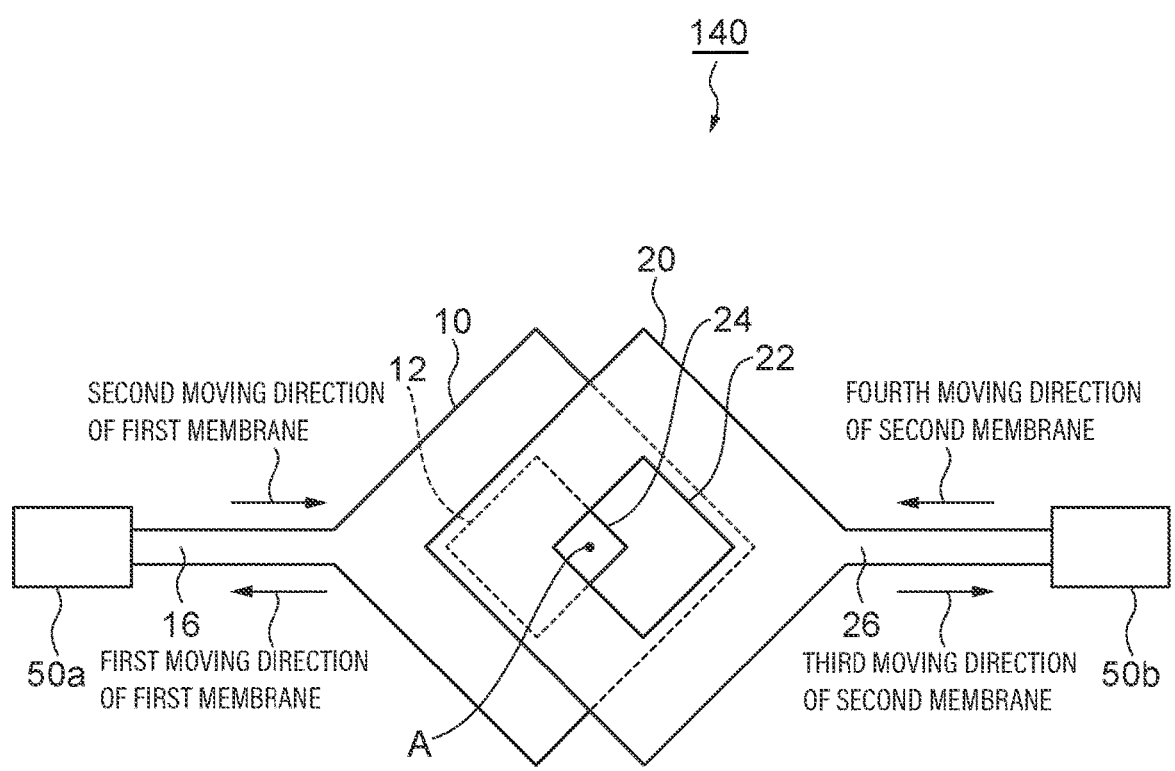
FIG. 23 is a schematic top view of the shaping aperture array for the charged particle beam apparatus of the third aspect of the third embodiment.

FIG. 23 is schematic top view of the shaping aperture array for the charged particle beam apparatus 140 of the third aspect of the present embodiment. A first solenoid actuator 50a is connected to the first support 16. A second solenoid actuator 50b is connected to the second support 26.

The first solenoid actuator 50a includes a wire coil and a plunger that can be housed in the wire coil (not shown). For example, the first support 16 is connected to such a plunger. The magnetic field generated by the wire coil allows the first membrane 10 to move in the first moving direction and the second moving direction via the plunger and the first support 16.

The second solenoid actuator 50b includes a wire coil and a plunger that can be housed in the wire coil (not shown). For example, the second support 26 is connected to such a plunger. The magnetic field generated by the wire coil allows the second membrane 20 to move in the third moving direction and the fourth moving direction via the plunger and second support 26. At this time, it is preferable that the first solenoid actuator 50a and the second solenoid actuator 50b operate accurately so that the first membrane 10 and the second membrane 20 move at equal distances in opposite directions.

Figure 24:
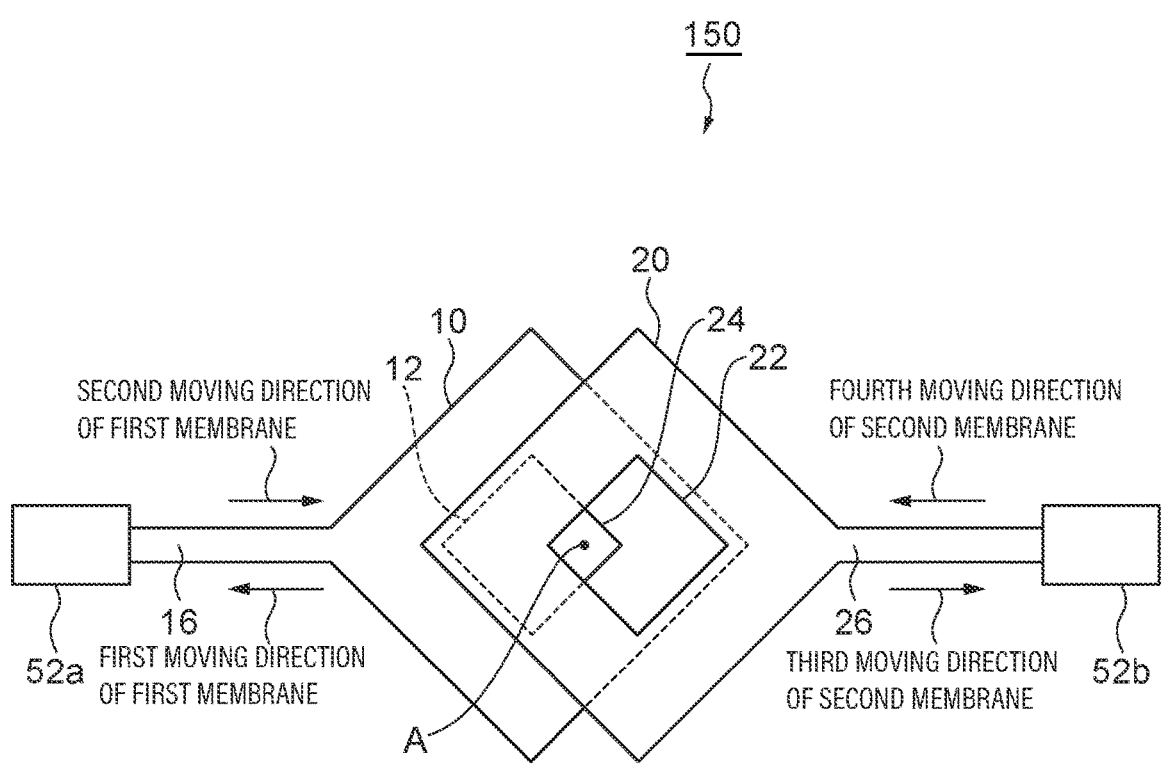
FIG. 24 is a schematic top view of the shaping aperture array for the charged particle beam apparatus of the fourth aspect of the third embodiment.

FIG. 24 is a schematic top view of the shaping aperture array for the charged particle beam apparatus 150 of the fourth aspect of the present embodiment. A first linear servo motor 52a is connected to the first support 16. As a result, the first membrane 10 is movable in the first moving direction and the second moving direction. Further, a second linear servo motor 52b is connected to the second support 26. As a result, the second membrane 20 is movable in the third moving direction and the fourth moving direction. At this time, it is preferable that the first linear servo motor 52a and the second linear servo motor 52b operate accurately so that the first membrane 10 and the second membrane 20 move at equal distances opposite to each other.

If the beam diameter is changed using the aperture plate of FIG. 2, which is a comparative example, optical axis of the beam is shifted, and it takes time to adjust the optical axis. For this reason, the entire part is often inspected in accordance with the minimum dimension of the beam. On the other hand, when the semiconductor device of the present embodiment is used, the beam diameter can be changed in a short time according to the size of target object, so that a desired inspection can be performed in a short time. Also, it is possible to inspect while changing the aperture diameter according to the dimensions when there are multiple areas, i.e. a large pattern dimension area, a medium pattern dimension area, and a fine pattern dimension area. Since the variable aperture of the present application can arbitrarily change the beam diameter, the aperture diameter and the pixels of the inspection can be arbitrarily changed according to the dimensions of the pattern-under-test, and thus the inspection times can be shortened.

According to the shaping aperture array of the charged particle beam apparatus and the charged particle beam apparatus of the present embodiment, the shaping aperture array for the charged particle beam apparatus and the charged particle beam apparatus which can reduce the adjusting times associated with changing beam diameters, reduce viewing times, reduce drawing times, and reduce inspection times, can be provided.

Fourth Embodiment

The charged particle beam pattern forming device of the present embodiment is different from that of the first embodiment in that it further includes a first semiconductor layer provided below the first element and the second element, and the first semiconductor layer being provided separately from the first element and the second element; and a second semiconductor layer provided above the first element and the second element, and the second semiconductor layer being provided separately from the first element and the second element, wherein the driver includes a first electrode connected to the first element, a second electrode connected to the second element, a third semiconductor layer provided between the first semiconductor layer and the second semiconductor layer, and the third semiconductor layer being provided separately from the first element in the first direction or in the second direction, a third electrode connected to the third semiconductor layer, a fourth semiconductor layer provided between the first semiconductor layer and the second semiconductor layer, and the fourth semiconductor layer being provided separately from the second element in the first direction or in the second direction, and a fourth electrode connected to the fourth semiconductor layer. Descriptions of the contents overlapping with those of the first to third embodiments will be omitted.

FIG. 25A-B is schematic diagram of the shaping aperture array for the charged particle beam apparatus 160 of the present embodiment. FIG. 25A is schematic top view of the shaping aperture array for the charged particle beam apparatus 160 of the present embodiment. FIG. 25B is schematic cross-sectional view of the shaping aperture array for the charged particle beam apparatus 160 in A-A' cross-section of FIG. 25A. In FIG. 25A, some elements are omitted.

For example, the first direction is the −X-direction and the second direction is the X-direction.

The shaping aperture array for the charged particle beam apparatus 160 of the present embodiment can be preferably formed, for example, by MEMS processing. The shaping aperture array for the charged particle beam apparatus 160 of the present embodiment preferably includes, for example, a MEMS configuration. This is because it is formed by a so-called semiconductor process such as lithography and etching, and is therefore suitable for manufacturing the membrane or the shaping aperture array for the charged particle beam apparatus having a high processing accuracy and a fine aperture diameter.

The shaping aperture array for the charged particle beam apparatus 160 of the present embodiment is formed, for example, by forming the first membrane 10 and the second membrane 20 on two SOI (Silicon on Insulator) substrates, respectively, and then bonding the two SOI substrate, as will be described later. Note that the shaping aperture array for the charged particle beam apparatus 160 of the present embodiment is not limited to this.

Figure 26A:
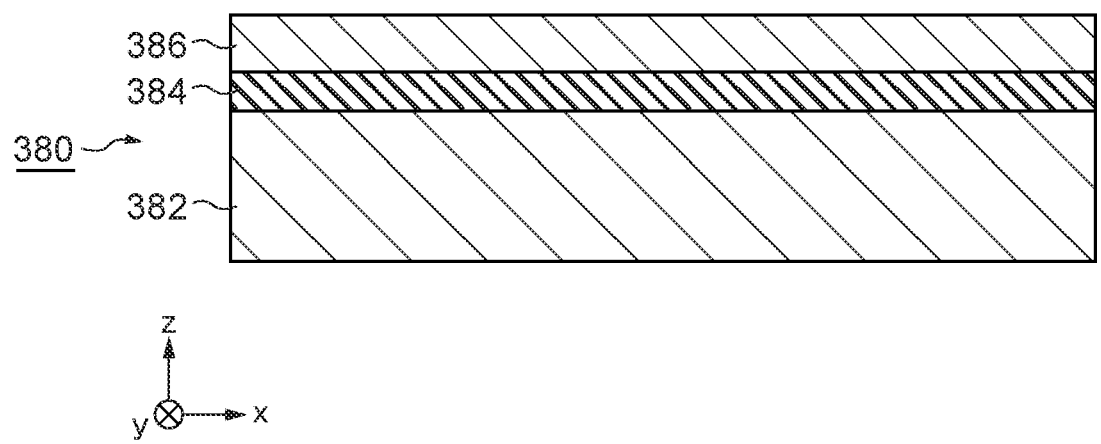
FIG. 26A-B are schematic cross-sectional views of a SOI substrate of the fourth embodiment.
Figure 26B:
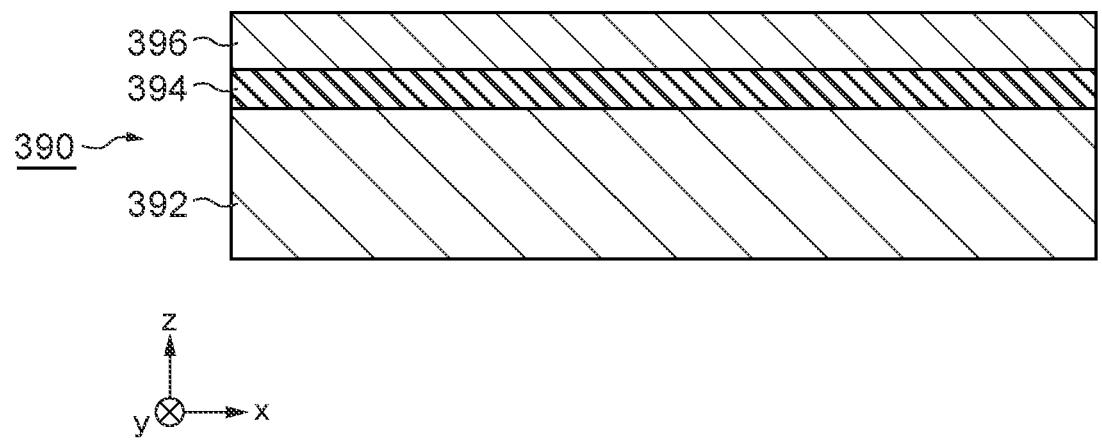

FIG. 26A-B is schematic cross-sectional views of the SOI substrate of the present embodiment. FIG. 26A is a schematic cross-sectional view of a first SOI substrate 380. The first SOI substrate 380 includes an eleventh semiconductor layer 382, a twelfth semiconductor layer 386, and an eleventh insulating layer 384 provided between the eleventh semiconductor layer 382 and the twelfth semiconductor layer 386. The eleventh semiconductor layer 382 and the twelfth semiconductor layer 386 are, for example, but not limited to, Si (silicon) layers. The eleventh insulating layer 384 is, for example, but not limited to, a silicon-oxide layer. The first semiconductor layer 60 is formed from the eleventh semiconductor layer 382. A third semiconductor layer 64a, the first membrane 10, and a sixth semiconductor layer 64b are formed from the twelfth semiconductor layer 386. A first insulating layer 62a and a second insulating layer 62b are formed from the eleventh insulating layer 384.

FIG. 26B is a schematic cross-sectional view of second SOI substrate 390. The second SOI substrate 390 includes a twenty-first semiconductor layer 392, a twenty-second semiconductor layer 396, and a twenty-first insulating layer 394 provided between the twenty-first semiconductor layer 392 and the twenty-second semiconductor layer 396. The twenty-first semiconductor layer 392 and the twenty-second semiconductor layer 396 are, for example, but not limited to, Si (silicon) layers. The twenty-first insulating layer 394 is, for example, but is not limited to, a silicon-oxide layer. The second semiconductor layer 80 is formed from the twenty-first semiconductor layer 392. The fifth semiconductor layer 84a, the second membrane 20 and the fourth semiconductor layer 84b are formed from the twenty-second semiconductor layer 396. The third insulating layer 82a and the fourth insulating layer 82b is formed from the twenty-first insulating layer 394.

The twelfth semiconductor layer 386 and the twenty-second semiconductor layer 396 preferably include a p-type impurity or an n-type impurity. This is because, as will be described later, in order to apply an electrostatic attractive force, it is preferable to contain such impurities and have electrical conductivity.

The first semiconductor layer 60a and the first semiconductor layer 60b as the first semiconductor layer 60 includes a first through hole 61. The first through hole 61 is a through hole through which the electron beam B passes.

The first insulating layer 62a and the second insulating layer 62b are provided on the first semiconductor layer 60a and the first semiconductor layer 60b, respectively.

The third semiconductor layer 64a is provided on the first insulating layer 62a. In other words, the third semiconductor layer 64a is provided separately from the first semiconductor layer 60a via the first insulating layer 62a in the Z-direction. The third semiconductor layer 64a is provided separately from the first membrane 10 in the X-direction. In addition, the first semiconductor layer 60 and the first membrane 10 are provided separately from each other in the Z-direction by the first insulating layer 62a.

The sixth semiconductor layer 64b is provided on the second insulating layer 62b. In other words, the sixth semiconductor layer 64b is provided separately from the first semiconductor layer 60b via the second insulating layer 62b in the Z-direction. The sixth semiconductor layer 64b is provided separately from the first membrane 10 in the X-direction. In addition, the sixth semiconductor layer 64b and the first membrane 10 are provided separately from each other in the Z-direction by the second insulating layer 62b.

A first bonding layer 70a is provided on the third semiconductor layer 64a.

A second bonding layer 70b is provided on the sixth semiconductor layer 64b.

A third bonding layer 86a is provided on the first bonding layer 70a.

A fourth bonding layer 86b is provided on the second bonding layer 70b.

The first bonding layer 70a, the second bonding layer 70b, the third bonding layer 86a, and the fourth bonding layer 86b include, for example, metals. The first bonding layer 70a, the second bonding layer 70b, the third bonding layer 86a, and the fourth bonding layer 86b include metallic materials such as Cr (chromium), Au (gold), Al (aluminium), or Ir (iridium).

The third insulating layer 82a is provided on the fifth semiconductor layer 84a.

The fourth insulating layer 82b is provided on the fourth semiconductor layer 84b.

The fifth semiconductor layer 84a is provided on the third bonding layer 86a. The fifth semiconductor layer 84a is provided separately from the second semiconductor layer 80a via the third insulating layer 82a in the Z-direction. The fifth semiconductor layer 84a is provided separately from the second membrane 20 in X-direction. In addition, the second semiconductor layer 80a and the second membrane 20 are provided separately from each other in the Z-direction by the third insulating layer 82a.

The fourth semiconductor layer 84b is provided on the fourth bonding layer 86b. The fourth semiconductor 84b is provided separately from the fifth semiconductor layer 84a via the fourth insulating layer 82b in the Z-direction. The fourth semiconductor layer 84b is provided separately from the second membrane 20 in the X-direction. In addition, the second semiconductor layer 80b and the second membrane 20 are provided separately from each other in the Z-direction by the fourth insulating layer 82b.

The second semiconductor layer 80a and the second semiconductor layer 80b as the second semiconductor layer 80 includes a second through hole 81. The second through hole 81 is a through hole through which the electron beam B passes. The second semiconductor layer 80a and the second semiconductor layer 80b are provided at positions facing each other across the second through hole 81 in the X-direction.

The third element 74a is provided between the first semiconductor layer 60 and the second semiconductor layer 80a and provided separately from the first membrane 10 in −Y-direction. The third element 74a includes, for example, a portion of the eleventh insulating layer 384 and a portion of the twelfth semiconductor layer 386. The third element 74a is in contact with the first semiconductor layer 60.

The fourth element 76a connects the first membrane 10 and the third element 74a. For example, the fourth element 76a extends in the −Y-direction or in the Y-direction. The fourth element 76a includes, for example, a portion of the twelfth semiconductor layer 386.

The film thickness of the first membrane 10 in the Z-direction is larger than the film thickness of the fourth element 76a in the Z-direction. The width of the third element 74a in the X-direction is longer than the width of the fourth element 76a in the X-direction.

The fifth element 74b is provided between the first semiconductor layer 60 and the second semiconductor layer 80a and provided separately from the second membrane 20 in −Y-direction. The fifth element 74b includes, for example, a portion of the twenty-first insulating layer 394 and a portion of the twenty-second semiconductor layer 396. The fifth element 74b is in contact with the second semiconductor layer 80.

The sixth element 76b connects the second membrane 20 and the fifth element 74b. For example, the sixth element 76b extends in the −Y-direction or in the Y-direction. The sixth element 76b includes, for example, a portion of the twenty-second semiconductor layer 396.

The film thickness of the second membrane 20 in the Z-direction is larger than the film thickness of the sixth element 76b in the Z-direction. The width of the fifth element 74b in the X-direction is longer than the width of the sixth element 76b in the X-direction.

The seventh element 72a is provided between the third semiconductor layer 64a and the fourth element 76a. The seventh element 72a includes, for example, a portion of the eleventh insulating layer 384 and a portion of the twelfth semiconductor layer 386. The third element 74a is in contact with the first semiconductor layer 60. Here, the seventh element 72a includes an insulating layer 72a1 and a semiconductor layer 72a2 provided on the insulating layer 72a1. In the following drawings, the insulating layer 72a1 and the semiconductor layer 72a2 are collectively illustrated as the seventh element 72a. In addition, the third element 74a includes an insulating layer 74a1 and a semiconductor layer 74a2 provided on the insulating layer 74a1. In the following drawings, the insulating layer 74a1 and the semiconductor layer 74a2 are collectively illustrated as the third element 74a.

The eighth element 72b is provided between the fourth semiconductor layer 84b and the sixth element 76b. The eighth element 72b includes, for example, a portion of the twenty-first insulating layer 394 and a portion of the twenty-second semiconductor layer 396. The fifth element 74b is in contact with the second semiconductor layer 80. Here, the eighth element 72b includes an insulating layer 72b1 and a semiconductor layer 72b2 provided below the insulating layer 72b1. In the following drawings, the insulating layer 72b1 and the semiconductor layer 72b2 are collectively illustrated as the eighth element 72b. In addition, the fifth element 74b includes an insulating layer 74b1 and a semiconductor layer 74b2 provided below the insulating layer 74b1. In the following drawings, the insulating layer 74b1 and the semiconductor layer 74b2 are collectively illustrated as the fifth element 74b.

The first electrode 66a is provided on the third semiconductor layer 64a and is in contact with the third semiconductor layer 64a.

The second electrode 66b is provided on the sixth semiconductor layer 64b and is in contact with the sixth semiconductor layer 64b. The second electrode 66b, as will be described later, is for applying an electric potential to the sixth semiconductor layer 84b, thus it may be provided in contact with, for example, the fourth semiconductor layer 84b.

The third electrode 75a is provided on the third element 74a and is in contact with the third element 74a.

The fourth electrode 75b is provided below the fifth element 74b and is in contact with the fifth element 74b.

The first electrode 66a, the second electrode 66b, the third electrode 75a, and the fourth electrode 75b include, for example, an electrically conductive material such as metal.

At this time, the length of the first semiconductor layer 60 in the direction parallel to the first direction and the second direction (e.g. X-direction) is longer than the length of the second semiconductor layer 80 in the direction parallel to the first direction and the second direction. The first electrode 66a and the second electrode 66b are formed on the first SOI substrate 380. Therefore, when the length of the first semiconductor layer 60 formed from the first SOI substrate 380 is longer, the manufacturing is facilitated.

The ninth element 74c is provided between the first semiconductor layer 60 and the second semiconductor layer 80a and is provided separately from the first membrane 10 in the Y-direction. The ninth element 74c includes, for example, a portion of the eleventh insulating layer 384 and a portion of the twelfth semiconductor layer 386. The ninth element 74c is in contact with the first semiconductor layer 60.

The tenth element 76c connects the first membrane 10 and the ninth element 74c. For example, the tenth element 76c extends in the −Y-direction or in the Y-direction. The tenth element 76c includes, for example, a portion of the twelfth semiconductor layer 386.

The width of the ninth element 74c in the X-direction is longer than the width of the tenth element 76c in the X-direction.

The eleventh element 74d is provided between the first semiconductor layer 60 and the second semiconductor layer 80a and is provided separately from the second membrane 20 in the Y-direction. The eleventh element 74d includes, for example, a portion of the twenty-first insulating layer 394 and a portion of the twenty-second semiconductor layer 396. The eleventh element 74d is in contact with the second semiconductor layer 80.

The twelfth element 76d connects the second membrane 20 and the eleventh element 74d. For example, the twelfth element 76d extends in the −Y-direction or in the Y-direction. The twelfth element 76d includes, for example, a portion of the twenty-second semiconductor layer 396.

The width of the eleventh element 74d in the X-direction is longer than the width of the twelfth element 76d in the X-direction.

The thirteenth element 72c is provided between the third semiconductor layer 64a and the tenth element 76c. The thirteenth element 72c includes, for example, a portion of the eleventh insulating layer 384 and a portion of the twelfth semiconductor layer 386. The ninth element 74c is in contact with the first semiconductor layer 60.

The fourteenth element 72d is provided between the fourth semiconductor layer 84b and the twelfth element 76d. The fourteenth element 72d includes, for example, a portion of the twenty-first insulating layer 394 and a portion of the twenty-second semiconductor layer 396. The fourteenth element 72d is in contact with the second semiconductor layer 80.

FIG. 27A-B is a schematic diagram showing a condition when using the shaping aperture array for the charged particle beam apparatus 160 to form an electron beam having a smaller beam diameter.

For example, a positive electric potential is applied to the first electrode 66a. Then, the third semiconductor layer 64a is positively charged. Further, a negative electric potential is applied to the third electrode 75a. Then, the third element 74a is negatively charged. Further, the first membrane 10 is negatively charged from the third element 74a via the fourth element 76a. The electrostatic attraction between the third semiconductor layer 64a and the first membrane 10 attracts the third semiconductor layer 64a and the first membrane 10 to each other. Here, as described above, the film thickness of the first membrane 10 in the Z-direction is larger than the film thickness of the fourth element 76a in the Z-direction. The width of the third element 74a in the X-direction is longer than the width of the fourth element 76a in the X-direction. Therefore, the fourth element 76a is relatively easy to bend. Similarly, the tenth element 76c is relatively easy to bend. Therefore, as shown in FIG. 15, the first membrane 10 moves in the first moving direction. Note that a negative electric potential may be applied to the first electrode 66a and a positive electric potential may be applied to the third electrode 75a. Incidentally, there is no problem only by applying a positive electric potential to the first electrode 66a and grounding the third electrode 75a.

Next, for example, a positive electric potential is applied to the first electrode 66a and a positive potential is applied to the third electrode 75a. Then, the third semiconductor layer 64a is positively charged. In addition, the third element 74a is positively charged. Further, the first membrane 10 is positively charged via the fourth element 76a. The electrostatic attraction between the third semiconductor layer 64a and the first membrane 10 repels the third semiconductor layer 64a and the first membrane 10 to each other. Therefore, the first membrane 10 moves in the second moving direction. Note that a negative electric potential may be applied to the first electrode 66a and a negative electric potential may be applied to the third electrode 75a. Incidentally, there is no problem only by grounding the first electrode 66a and the third electrode 75a. The stiffness of the springs 76a, 76c supporting the membrane causes the first membrane 10 to move in the second moving direction.

Similarly, by applying a positive electric potential to the second electrode 66b and a negative electric potential to the fourth electrode 75b, the second membrane 20 moves in the third moving direction. Here, the electric potential applied to the second electrode 66b is applied to the sixth semiconductor layer 84b via the conductive second bonding layer 70b and the conductive fourth bonding layer 86b. Incidentally, a negative electric potential may be applied to the second electrode 66b and a positive electric potential may be applied to the fourth electrode 75b. Incidentally, there is no problem only by applying a positive electric potential to the first electrode 66b and grounding the third electrode 75b.

Similarly, by applying a positive electric potential to the second electrode 66b and applying a positive electric potential to the fourth electrode 75b, the second membrane 20 moves in the fourth moving direction. Note that a negative electric potential may be applied to the second electrode 66b and a negative electric potential may be applied to the fourth electrode 75b. Incidentally, there is no problem only by grounding the first electrode 66b and the third electrode 75b. The stiffness of the springs 76b, 76b supporting the membrane causes the second membrane 20 to move in the fourth moving direction.

The seventh element 72a and the thirteenth element 72c inhibit the first membrane 10 from moving in the first moving direction more than necessary.

The eighth element 72b and the fourteenth element 72d inhibit the second membrane 20 from moving in the second moving direction more than necessary.

FIG. 28 to FIG. 33 are schematic cross-sectional views showing the manufacturing process of the shaping aperture array for the charged particle beam apparatus of the present embodiment. Here, the manufacturing process of the constituent elements shown in A-A' cross sections (FIG. 25A-B and FIG. 27A-B) will be mainly described.

Figure 28:
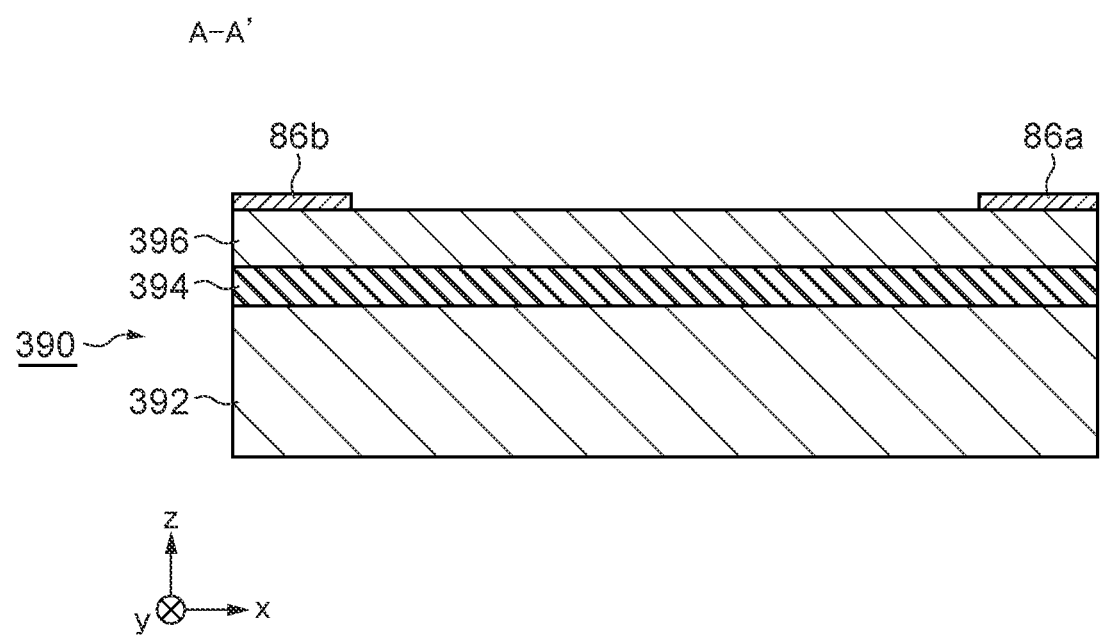
FIG. 28 is a schematic cross-sectional view showing a manufacturing process of shaping aperture array for charged particle beam apparatus of the fourth embodiment.

The third bonding layer 86a and the fourth bonding layer 86b which are in contact with the twenty-second semiconductor layer 396 are formed on the twenty-second semiconductor layer 396 of the second SOI substrate 390. Here, the second SOI substrate 390 includes the twenty-first semiconductor layer 392, the twenty-second semiconductor layer 396, and the twenty-first insulating layer 394 provided between the twenty-first semiconductor layer 392 and the twenty-second semiconductor layer 396 (FIG. 28). For example, a film including Cr and Au is formed by a sputtering method. Thereafter, by lithography and etching using a photoresist, the third bonding layer 86a and the fourth bonding layer 86b are formed as shown in FIG. 28. The photoresist is removed by asking or the like.

Figure 29:
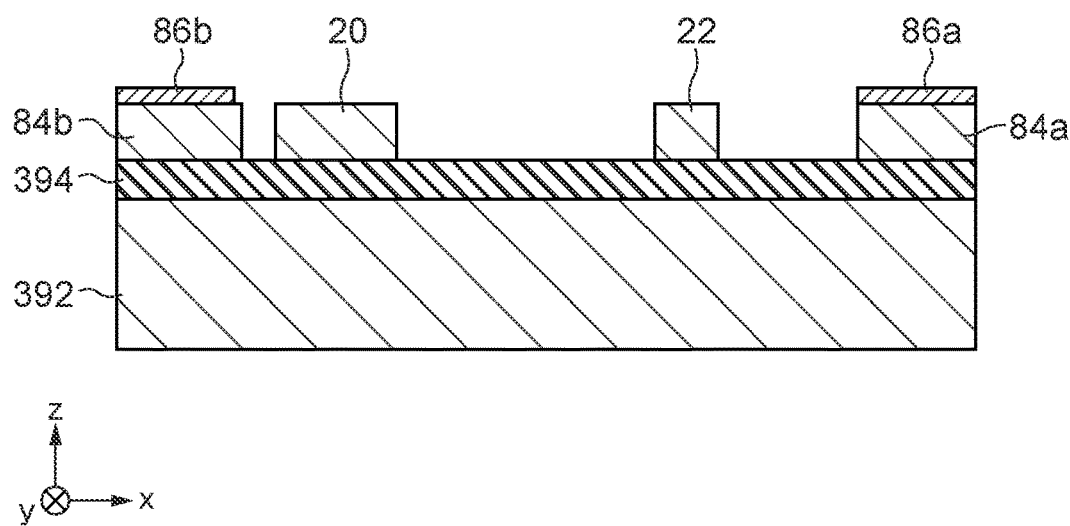
FIG. 29 is a schematic cross-sectional view showing a manufacturing process of shaping aperture array for charged particle beam apparatus of the fourth embodiment.

Next, the second membrane 20 is formed using the twenty-second semiconductor layer 396 by lithography and etching using a photoresist. At the same time, the fifth semiconductor layer 84a is formed between the twenty-first insulating layer 394 and the third bonding layer 86a, and the fourth semiconductor layer 84b is formed between the twenty-first insulating layer 394 and the fourth bonding layer 86b (FIG. 29).

Figure 30:
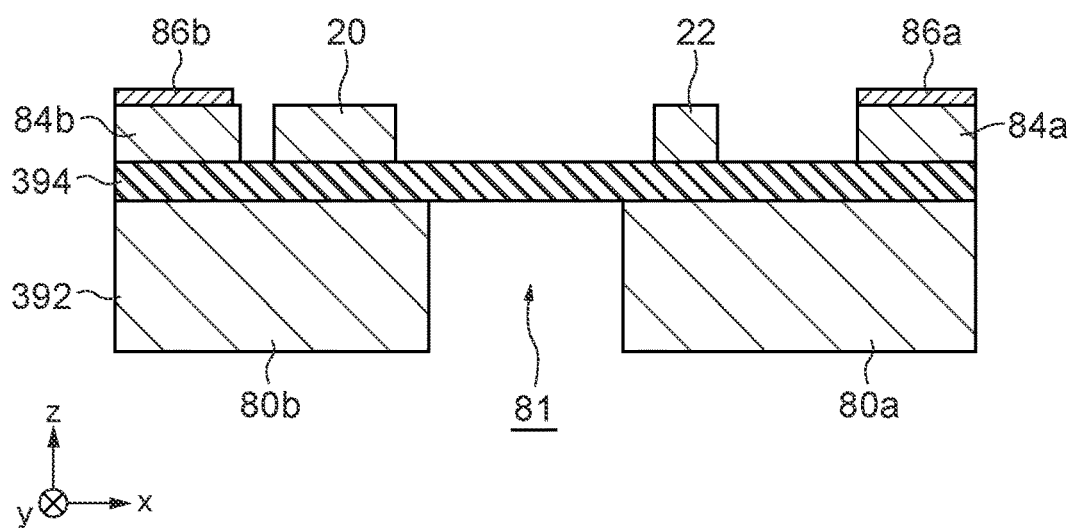
FIG. 30 is a schematic cross-sectional view showing a manufacturing process of shaping aperture array for charged particle beam apparatus of the fourth embodiment.

Next, by anisotropic etching such as lithography using a photoresist and Si deep RIE method, the second through hole 81 such that the twenty-first insulating layer 394 is exposed in the twenty-first semiconductor layer 392 is formed. Here, the twenty-first semiconductor layer illustrated on the left side of the second through hole 81 is illustrated as the second semiconductor layer 80a, and the twenty-first semiconductor layer illustrated on the right side of the second through hole 81 is illustrated as the second semiconductor layer 80b (FIG. 30).

Figure 31:
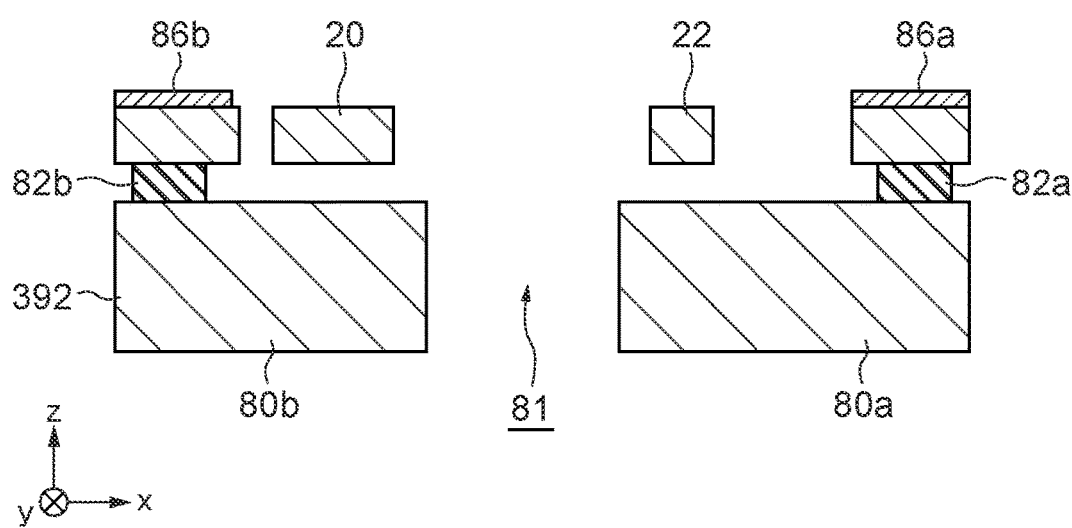
FIG. 31 is a schematic cross-sectional view showing a manufacturing process of shaping aperture array for charged particle beam apparatus of the fourth embodiment.

Next, the third insulating layer 82a is formed between the second semiconductor layer 80a and the fifth semiconductor layer 84a using the twenty-first insulating layer 394, for example, by steam hydrofluoric acid treatment. At the same time, the fourth insulating layer 82b is formed between the second semiconductor layer 80b and the fourth semiconductor layer 84b using the twenty-first insulating layer 394 (FIG. 31).

Figure 32:
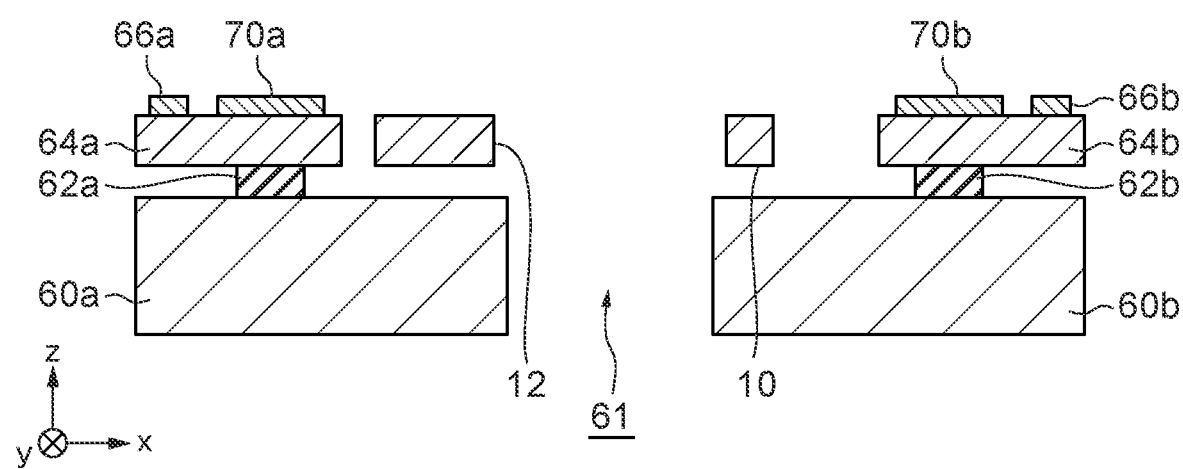
FIG. 32 is a schematic cross-sectional view showing a manufacturing process of shaping aperture array for charged particle beam apparatus of the fourth embodiment.

Similarly, the first through hole 61, the first semiconductor layer 60a, the first semiconductor layer 60b, the first insulating layer 62a, the second insulating layer 62b, the first membrane 10, the third semiconductor layer 64a, the sixth semiconductor layer 64b, the first electrode 66a, the first bonding layer 70a, and the second bonding layer 70b are formed using the first SOI substrate 380. Here, the first SOI substrate 380 includes the eleventh semiconductor layer 382, the twelfth semiconductor layer 386, and the eleventh insulating layer 384 provided between the eleventh semiconductor layer 382 and the twelfth semiconductor layer 386 (FIG. 32).

Figure 33:
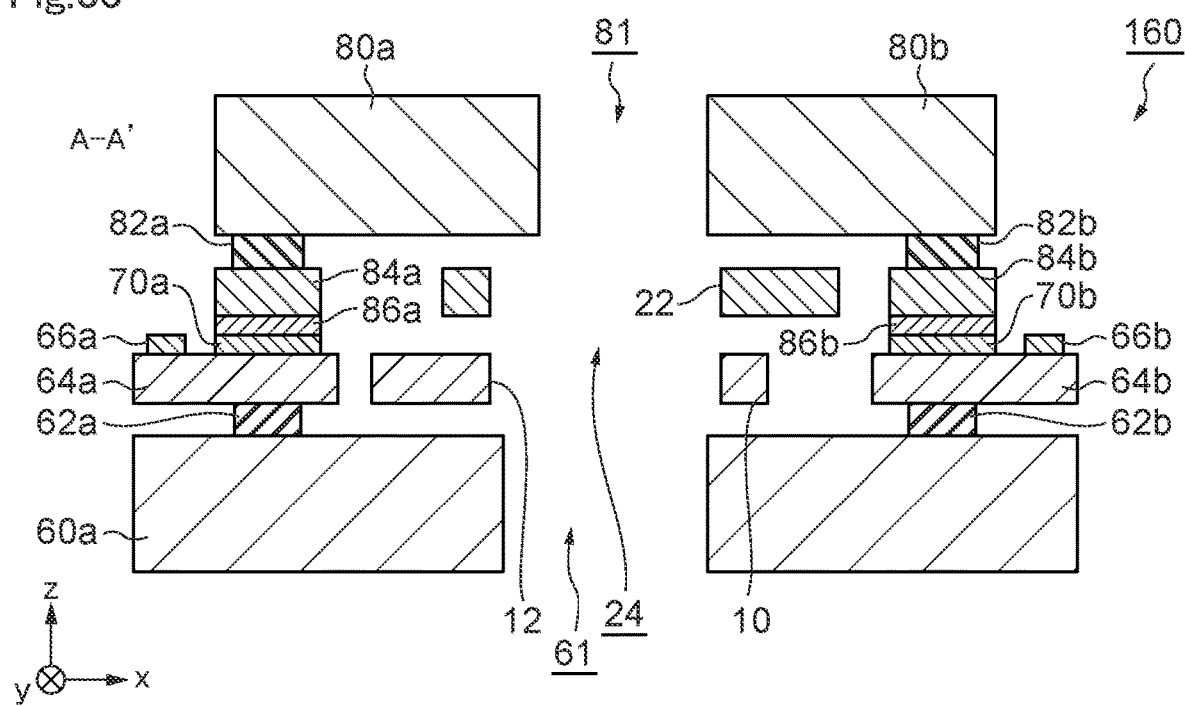
FIG. 33 is a schematic cross-sectional view showing a manufacturing process of shaping aperture array for charged particle beam apparatus of the fourth embodiment.

Then, the first bonding layer 70a and the third bonding layer 86a, and the second bonding layer 70b and the fourth bonding layer 86b are bonded, for example, by thermocompression bonding, to obtain the shaping aperture array for the charged particle beam apparatus 160 of the present embodiment (FIG. 33).

If the beam diameter is changed using the aperture plate of FIG. 2, which is a comparative example, optical axis of the beam is shifted, and it takes time to adjust. For this reason, the entire part is often inspected in accordance with the minimum dimension. On the other hand, when the semiconductor device of the present embodiment is used, the beam diameter can be changed in a short time according to the size of target object, so that a desired inspection can be performed in a short time. Also, it is possible to inspect while changing the aperture diameter according to the dimensions when there are multiple areas, i.e. a large pattern dimension area, a medium pattern dimension area, and a fine pattern dimension area. Since the variable aperture of the present application can arbitrarily change the beam diameter, the aperture diameter and the pixels of the inspection can be arbitrarily changed according to the dimensions of the pattern-under-test, and thus the inspection times can be shortened.

According to the shaping aperture array of the charged particle beam apparatus and the charged particle beam apparatus of the present embodiment, the shaping aperture array for the charged particle beam apparatus and the charged particle beam apparatus which can reduce the adjusting times associated with changing beam diameters, reduce viewing times, reduce drawing times, and reduce inspection times, can be provided.

Note that when the charged particle beam apparatus is used as an inspection apparatus, the object to be inspected can be not only for patterns on a wafer, a liquid crystal display, but also for photomask. The acceleration voltage is set to be low, for example, 1 kV or less, and it is possible to prevent the charge-up. Further, since the EUV (Extreme Ultraviolet) mask includes a multi-layer mirror made of a low-resistance material such as Mo (molybdenum) or Si, it is easily inspected.

Here, the embodiment is explained by taking the electron beam as an example. However, the observation or the drawing using an ion beam is also possible. The observation or the exposure of the resist can be performed using the beams of low atomic weight ions, such as H (hydrogen) ion beam, He (helium) ion beam, B (boron) ion beam, and Ar (argon) ion beam, by manipulating the beam or moving the target object stages, in the same way as the electron beam. In addition, high atomic weight beams such as Ga ions and In ions can be used to fabricate masks and structures on wafers directly. Further, it is also possible to perform a chemical reaction by irradiating the above ions under a gas atmosphere to process a structure on a mask or a wafer.

While certain embodiments have been described, these embodiments have been presented by way of example only, and are not intended to limit the scope of the inventions. Indeed, the charged particle beam pattern forming device and the charged particle beam apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A charged particle beam pattern forming device, a charged particle beam passing through a third aperture for forming a charged particle beam pattern, the charged particle beam pattern forming device comprising:
    a first element including a plurality of first apertures arranged periodically, and
    a second element including a plurality of second apertures arranged periodically, the second plurality of apertures overlapping the first plurality of apertures,
    wherein each of a plurality of third apertures are defined by an overlap of a corresponding first aperture and a corresponding second aperture, and a shape of each third aperture is capable of being changed by a driver such that the first element is moved in a first direction and the second element is moved in a second direction opposite to the first direction, and
    wherein the driver is configured to move the first element and the second element such that a center of each third aperture provided by the overlap of the corresponding first aperture and the corresponding second aperture is a designed optical axis of the charged particle beam pattern to be formed.

2. The charged particle beam pattern forming device according to claim 1,
    wherein the driver is configured to move the first element and the second element by substantially the same distance.

3. The charged particle beam pattern forming device according to claim 1,
    wherein the driver is configured to move the first element and the second element in opposite directions such that a center of a corresponding third aperture provided by the overlap of the first aperture and the second aperture does not move.

4. The charged particle beam pattern forming device according to claim 1,
    wherein a shape of the first aperture is a predetermined square,
    wherein a shape of the second aperture is the predetermined square, and
    wherein the first direction and the second direction are respectively parallel to a diagonal line of the predetermined square.

5. The charged particle beam pattern forming device according to claim 1,
    wherein the first element and the second element include silicon.

6. The charged particle beam pattern forming device according to claim 1,
    wherein the driver includes
    a first stepper motor,
    a first pinion gear connected to the first stepper motor, and the first pinion gear being rotatable in a predetermined plane including the first direction and the second direction,
    a first rack gear meshed with the first pinion gear, and the first rack gear being capable of moving the first element in the first direction, and
    a second rack gear meshed with the first pinion gear, and the second rack gear being capable of moving the second element in the second direction.

7. The charged particle beam pattern forming device according to claim 6,
    wherein the first pinion gear is provided between the first rack gear and the second rack gear in the predetermined plane.

8. The charged particle beam pattern forming device according to claim 1,
    wherein the driver includes
    a first stepper motor,
    a first pinion gear connected to the first stepper motor, and the first pinion gear being rotatable in a predetermined plane including the first direction and the second direction,
    a first rack gear meshed with the first pinion gear, and the first rack gear being capable of moving the first element in the first direction,
    a second stepper motor,
    a second pinion gear connected to the second stepper motor, and the second pinion gear being rotatable in the predetermined plane, and
    a second rack gear meshed with the second pinion gear, and the second rack gear being capable of moving the second element in the second direction.

9. The charged particle beam pattern forming device according to claim 8,
    wherein the first element and the second element are provided between the first rack gear and the second rack gear.

10. The charged particle beam pattern forming device according to claim 1,
    wherein the driver includes
    a first solenoid actuator connected to the first element, and
    a second solenoid actuator connected to the second element.

11. The charged particle beam pattern forming device according to claim 1,
    wherein the drive includes
    a first linear servo motor connected to the first element, and
    a second linear servo motor connected to the second element.

12. The charged particle beam pattern forming device according to claim 1, further comprising:
a first semiconductor layer provided below the first element and the second element, and the first semiconductor layer being provided separately from the first element and the second element; and
a second semiconductor layer provided above the first element and the second element, and the second semiconductor layer being provided separately from the first element and the second element,
wherein the driver includes
a first electrode connected to the first element,
a second electrode connected to the second element,
a third semiconductor layer provided between the first semiconductor layer and the second semiconductor layer, and the third semiconductor layer being provided separately from the first element in the first direction or in the second direction,
a third electrode connected to the third semiconductor layer,
a fourth semiconductor layer provided between the first semiconductor layer and the second semiconductor layer, and the fourth semiconductor layer being provided separately from the second element in the first direction or in the second direction, and
a fourth electrode connected to the fourth semiconductor layer.

13. The charged particle beam pattern forming device according to claim 12,
wherein the first element moves in the first direction by an electrostatic attraction between the first element and the third semiconductor layer, and
wherein the second element moves in the second direction by an electrostatic attraction between the second element and the fourth semiconductor layer.

14. The charged particle beam pattern forming device according to claim 12,
wherein a length of the first semiconductor layer parallel to the first direction is longer than a length of the second semiconductor layer parallel to the first direction.

15. The charged particle beam pattern forming device according to claim 12, further comprising:
a third element provided between the first semiconductor layer and the second semiconductor layer, the third element being provided separately from the first element in a direction intersecting the first direction and the second direction;
a fourth element extending in a direction intersecting the first direction and the second direction and connecting the first element and the third element;
a fifth element provided between the first semiconductor layer and the second semiconductor layer, the fifth element being provided separately from the second element in a direction intersecting the first direction and the second direction; and
a sixth element extending in a direction intersecting the first direction and the second direction, and the sixth element connecting the second element and the fifth element.

16. The charged particle beam pattern forming device according to claim 15,
wherein a film thickness of the first element is thicker than a film thickness of the fourth element,
and wherein a film thickness of the second element is thicker than a film thickness of the sixth element.

17. A charged particle beam apparatus, comprising:
an emitter for emitting the charged particle beam, and
a charged particle beam pattern forming device according to claim 1,
wherein the charged particle beam passes through the first aperture and the second aperture.

18. The charged particle beam apparatus according to claim 17,
wherein an optical axis of the charged particle beam emitted from the emitter passes through a third aperture defined by the overlap of a corresponding first aperture and a corresponding second aperture.

19. A charged particle beam pattern forming device, a charged particle beam passing through a third aperture for forming a charged particle beam pattern, the charged particle beam pattern forming device comprising:
a first element including a first aperture, and
a second element including a second aperture, the second aperture overlapping the first aperture,
wherein the third aperture is defined by an overlap of the first aperture and the second aperture, and a shape of the third aperture is capable of being changed by a driver such that the first element is moved in a first direction and the second element is moved in a second direction opposite to the first direction, and
wherein the driver includes
a first stepper motor,
a first pinion gear connected to the first stepper motor, and the first pinion gear being rotatable in a predetermined plane including the first direction and the second direction,
a first rack gear meshed with the first pinion gear, and the first rack gear being capable of moving the first element in the first direction,
a second stepper motor,
a second pinion gear connected to the second stepper motor, and the second pinion gear being rotatable in the predetermined plane, and
a second rack gear meshed with the second pinion gear, and the second rack gear being capable of moving the second element in the second direction.

20. A charged particle beam pattern forming device, a charged particle beam passing through a third aperture for forming a charged particle beam pattern, the charged particle beam pattern forming device comprising:
a first element including a first aperture,
a second element including a second aperture, the second aperture overlapping the first aperture,
a first semiconductor layer provided below the first element and the second element, and the first semiconductor layer being provided separately from the first element and the second element, and
a second semiconductor layer provided above the first element and the second element, and the second semiconductor layer being provided separately from the first element and the second element,
wherein the third aperture is defined by an overlap of the first aperture and the second aperture, and a shape of the third aperture is capable of being changed by a driver such that the first element is moved in a first direction and the second element is moved in a second direction opposite to the first direction, and
wherein the driver includes
a first electrode connected to the first element,
a second electrode connected to the second element,
a third semiconductor layer provided between the first semiconductor layer and the second semiconductor layer, and the third semiconductor layer being provided separately from the first element in the first direction or in the second direction,
a third electrode connected to the third semiconductor layer,
a fourth semiconductor layer provided between the first semiconductor layer and the second semiconductor layer, and the fourth semiconductor layer being provided separately from the second element in the first direction or in the second direction, and
a fourth electrode connected to the fourth semiconductor layer.

* * * * *